United States Patent
Park et al.

(10) Patent No.: US 9,536,846 B2
(45) Date of Patent: Jan. 3, 2017

(54) SEMICONDUCTOR DEVICES HAVING THROUGH ELECTRODES, METHODS OF FABRICATING THE SAME, ELECTRONIC SYSTEMS INCLUDING THE SAME, AND MEMORY CARDS INCLUDING SAME

(71) Applicant: SK hynix Inc., Icheon (KR)

(72) Inventors: Jin Woo Park, Yeoju (KR); Sung Su Park, Yongin (KR); Bae Yong Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/526,073

(22) Filed: Oct. 28, 2014

(65) Prior Publication Data

US 2016/0020184 A1    Jan. 21, 2016

(30) Foreign Application Priority Data

Jul. 16, 2014    (KR) ........................ 10-2014-0089995

(51) Int. Cl.
*H01L 23/00* (2006.01)
*H01L 23/48* (2006.01)
(Continued)

(52) U.S. Cl.
CPC ........... *H01L 24/05* (2013.01); *H01L 21/6835* (2013.01); *H01L 21/76898* (2013.01); *H01L 23/481* (2013.01); *H01L 24/03* (2013.01); *H01L 24/11* (2013.01); *H01L 24/13* (2013.01); *H01L 24/14* (2013.01); *H01L 2221/6834* (2013.01); *H01L 2221/68327* (2013.01); *H01L 2224/03002* (2013.01); *H01L 2224/034* (2013.01); *H01L 2224/0361* (2013.01); *H01L 2224/03614* (2013.01); *H01L 2224/03912* (2013.01); *H01L 2224/0401* (2013.01); *H01L 2224/051* (2013.01); *H01L 2224/05017* (2013.01); *H01L 2224/05138* (2013.01); *H01L 2224/05557* (2013.01); *H01L 2224/05558* (2013.01); *H01L 2224/05647* (2013.01); *H01L 2224/11002* (2013.01); *H01L 2224/119* (2013.01); *H01L 2224/1146* (2013.01);
(Continued)

(58) Field of Classification Search
CPC ........ H01L 24/05; H01L 23/481; H01L 24/13; H01L 2224/05557; H01L 2224/0401
See application file for complete search history.

(56) References Cited

U.S. PATENT DOCUMENTS 7,034,402 B1 * 4/2006 Seshan .................... H01L 24/03
257/737
8,212,357 B2 * 7/2012 Daubenspeck ......... H01L 24/13
257/737

(Continued)

FOREIGN PATENT DOCUMENTS

KR    10-2013-0016755 A    2/2013

*Primary Examiner* — Marc Armand
*Assistant Examiner* — Sue Tang

(57) ABSTRACT

A semiconductor device includes a chip body having an uneven surface including at least two regions at different levels from one another, a through electrode penetrating the chip body and having an end which is exposed by the uneven surface of the chip body, a passivation layer disposed on the uneven surface of the chip body, and a bump disposed on the passivation layer and the exposed end of the through electrode and overlapping with the uneven surface of the chip body.

20 Claims, 31 Drawing Sheets

(51) Int. Cl.
*H01L 21/768* (2006.01)
*H01L 21/683* (2006.01)

(52) U.S. Cl.
CPC .. *H01L 2224/1147* (2013.01); *H01L 2224/131* (2013.01); *H01L 2224/13006* (2013.01); *H01L 2224/13022* (2013.01); *H01L 2224/13025* (2013.01); *H01L 2224/13144* (2013.01); *H01L 2224/13147* (2013.01); *H01L 2224/13155* (2013.01); *H01L 2224/14181* (2013.01)

(56) References Cited

U.S. PATENT DOCUMENTS

| | | | |
|---|---|---|---|
| 2012/0049358 A1* | 3/2012 | Cheng | H01L 21/76898 257/738 |
| 2013/0037946 A1* | 2/2013 | Kim | H01L 21/76898 257/737 |
| 2013/0154112 A1* | 6/2013 | Zhang | H01L 23/3178 257/774 |
| 2013/0161824 A1* | 6/2013 | Choi | H01L 21/76898 257/774 |

* cited by examiner

SEMICONDUCTOR DEVICES HAVING THROUGH ELECTRODES, METHODS OF FABRICATING THE SAME, ELECTRONIC SYSTEMS INCLUDING THE SAME, AND MEMORY CARDS INCLUDING SAME

CROSS-REFERENCE TO RELATED APPLICATION

The present application claims priority under 35 U.S.C 119(a) to Korean Application No. 10-2014-0089995, filed on Jul. 16, 2014, in the Korean intellectual property Office, which is incorporated herein by reference in its entirety as set forth in full.

BACKGROUND

1. Technical Field

Embodiments of the present disclosure relate to semiconductor devices having through electrodes, methods of fabricating the same, electronic systems including the same, and memory cards including the same.

2. Related Art

Semiconductor devices employed in electronic systems may include various electronic circuit elements, and the electronic circuit elements may be integrated with a semiconductor substrate to constitute the semiconductor device, which may be referred to as a semiconductor chip or a semiconductor die. Before semiconductor devices including memory semiconductor chips are employed in electronic systems, the semiconductor devices may be encapsulated to have package forms. These semiconductor packages may be employed in the electronic systems such as computers, mobile systems or data storage media.

As mobile systems such as smart phones become lighter and smaller, the semiconductor packages employed in the mobile systems have been continuously scaled down. In addition, large capacitive semiconductor packages are increasingly in demand with the development of multi-functional mobile systems. To support scaling, efforts to put a plurality of semiconductor devices in a single package have been attempted to provide large capacitive semiconductor packages such as stack packages. Further, through silicon via (TSV) electrodes penetrating the semiconductor chip have been proposed to realize interconnection paths that electrically connect the semiconductor chips in a single stack package to each other.

SUMMARY

Various embodiments are directed to semiconductor devices having through electrodes, methods of fabricating the same, electronic systems including the same, and memory cards including the same.

According to an embodiment, a semiconductor device includes a chip body having an uneven surface including at least two regions at different levels from one another, a through electrode penetrating the chip body and having an end which is exposed by the uneven surface of the chip body, a passivation layer disposed on the uneven surface of the chip body, and a bump disposed on the passivation layer and the exposed end of the through electrode and overlapping with the uneven surface of the chip body.

According to another embodiment, a method of fabricating a semiconductor device includes forming a through electrode that penetrates a chip body having an uneven surface to have an end protruding from the uneven surface of the chip body, forming a passivation layer on the uneven surface of the chip body and the protruded end of the through electrode, planarizing the protruded end of the through electrode to expose the through electrode at a top surface of the passivation layer, and forming a bump on the through electrode and the passivation layer, wherein the bump overlaps with the uneven surface of the chip body, and wherein the uneven surface of the chip body includes at least two regions disposed at different levels.

According to another embodiment, an electronic system includes a semiconductor device. The semiconductor device includes a chip body having an uneven surface including at least two regions at different levels from one another, a through electrode penetrating the chip body and having an end which is exposed by the uneven surface of the chip body, a passivation layer disposed on the uneven surface of the chip body, and a bump disposed on the passivation layer and the exposed end of the through electrode and overlapping with the uneven surface of the chip body.

According to another embodiment, a memory card includes a semiconductor device. The semiconductor device includes a chip body having an uneven surface including at least two regions at different levels from one another, a through electrode penetrating the chip body and having an end which is exposed by the uneven surface of the chip body, a passivation layer disposed on the uneven surface of the chip body, and a bump disposed on the passivation layer and the exposed end of the through electrode and overlapping with the uneven surface of the chip body.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

The following embodiments may provide semiconductor devices which are capable of increasing a contact area between a passivation layer and a bump. Specifically, semiconductor devices according to some embodiments may include a chip body having an uneven surface with a recess and a through electrode penetrating the chip body such that an end of the through electrode is exposed at a portion of the uneven surface. A passivation layer may be disposed on the uneven surface of the chip body to have a surface profile which is consistent with the uneven surface of the chip body. A bump may cover the exposed end of the through electrode and may laterally extend onto the passivation layer to overlap with the recess. Thus, a contact area between the bump and the passivation layer increases to suppress a lift phenomenon of the bump.

It will be understood that although the terms first, second, third etc. may be used herein to describe various elements, these elements should not be limited by these terms. These terms are used to distinguish one element from another element. Thus, a first element in some embodiments could be termed a second element in other embodiments.

It will also be understood that when an element is referred to as being "on," "above," "below," or "under" another element, it can be directly "on," "above," "below," or "under" the other element, or intervening elements may also be present.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion.

Semiconductor chips or chips may be obtained by separating a semiconductor substrate or a wafer into a plurality of pieces using a die sawing process. The semiconductor chips may correspond to memory chips or logic chips. The memory chips may include dynamic random access memory (DRAM) circuits, static random access memory (SRAM) circuits, flash circuits, magnetoresistive random access memory (MRAM) circuits, resistive random access memory (ReRAM) circuits, ferroelectric random access memory (FeRAM) circuits or phase change random access memory (PcRAM) circuits which are integrated with the semiconductor substrate. The logic chips may include logic circuits which are integrated with the semiconductor substrate. In some embodiments, the term "semiconductor substrate" used herein may be construed as a semiconductor chip or a semiconductor die in which integrated circuits are formed.

Figure 1:
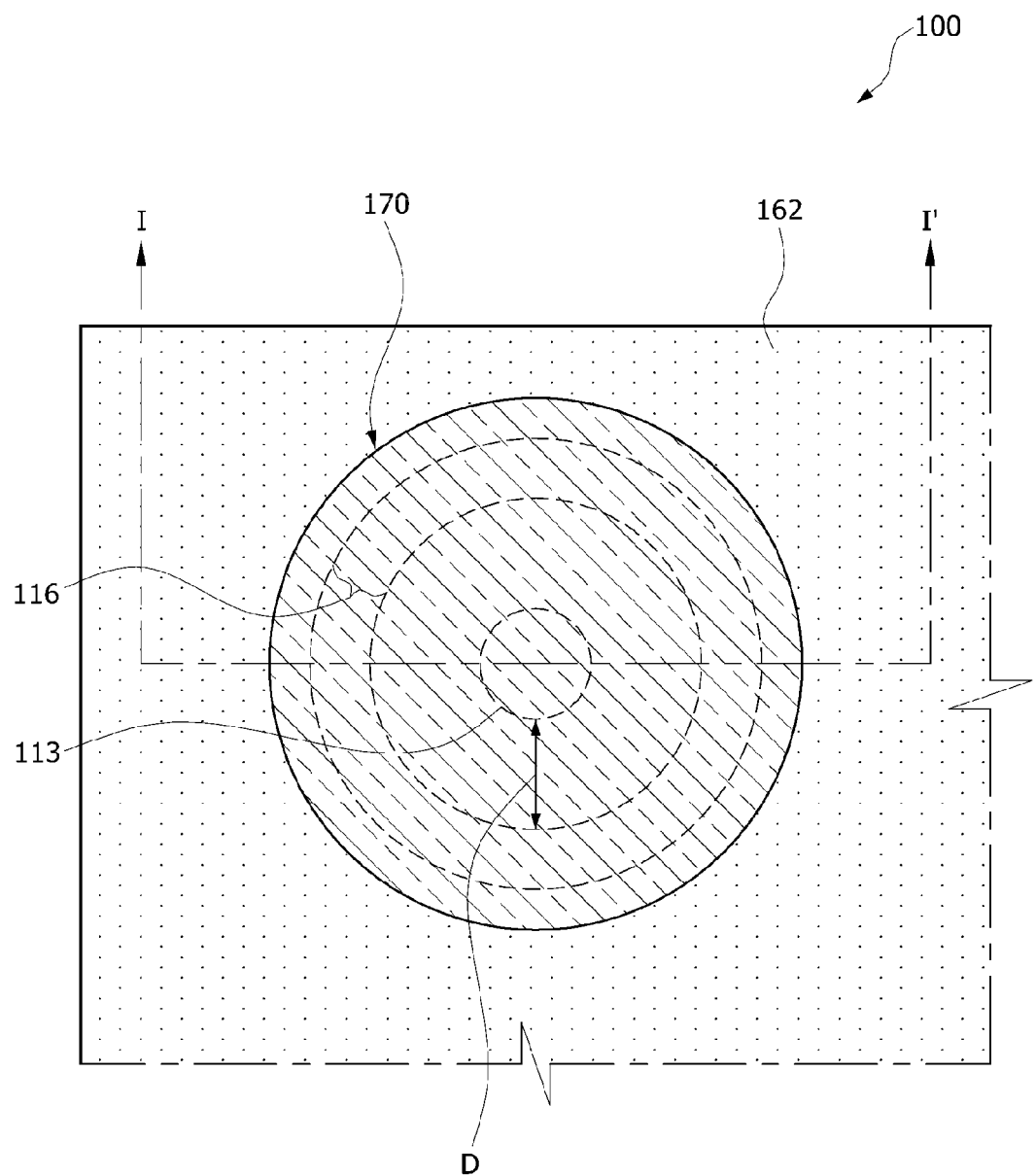
FIG. 1 is a plan view illustrating a portion of a semiconductor device according to an embodiment.
Figure 2:
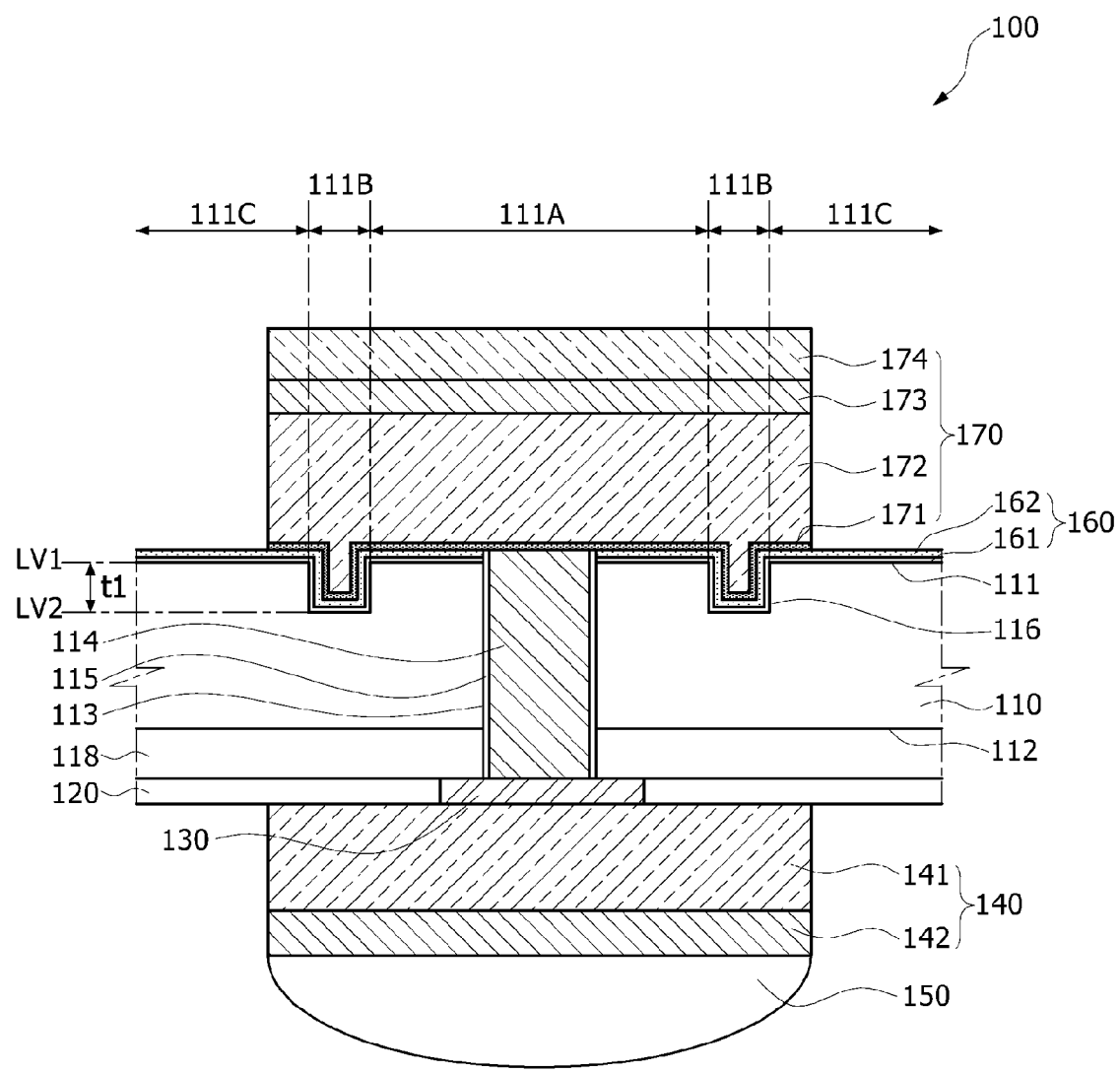
FIG. 2 is a cross-sectional view taken along line I-I' of FIG. 1.

FIG. 1 is a plan view illustrating a portion of a semiconductor device 100 according to an embodiment, and FIG. 2 is a cross-sectional view taken along a line I-I' of FIG. 1. Referring to FIGS. 1 and 2, the semiconductor device 100 may include a chip body 110 having a first surface 111 and a second surface 112. An active layer 118 may be disposed on the second surface 112 of the chip body 110. The first surface 111 of the chip body 110 may oppose the second surface 112 on which the active layer 118 is disposed. Although not shown in the drawings, circuit elements such as transistors and interconnection lines constituting integrated circuits may be disposed in the active layer 118.

A through electrode 114 may penetrate the chip body 110 and the active layer 118. The through electrode 114 may correspond to a through silicon via (TSV). The through electrode 114 may include a metal material, for example, a copper material or a copper alloy material containing copper and silicon. In some embodiments, the through electrode 114 may include a gallium (Ga) material, an indium (In) material, a tin (Sn) material, a silver (Ag) material, a mercury (Hg) material, a bismuth (Bi) material, a lead (Pb) material, a gold (Au) material, a zinc (Zn) material, an aluminum (Al) material, or an alloy containing at least two of these materials. The through electrode 114 may fill a though via hole 113 that penetrates the chip body 110 and the active layer 118. A diffusion barrier layer 115 may be disposed between the through electrode 114 and the chip body 110 as well as between the through electrode 114 and the active layer 118. The diffusion barrier layer 115 may prevent metal atoms in the through electrode 114 from being diffused into the chip body 110 and the active layer 118.

An end of the through electrode 114 may be exposed at a surface of the active layer 118 and contact a connection pad 130. The connection pad 130 may be disposed in an insulation layer 120 that covers a surface of the active layer 118 opposite to the chip body 110. A front side bump 140 may be disposed on a surface of the connection pad 130 opposite to the active layer 118. The front side bump 140 may include a first front side bump 141 and a second front side bump 142 which are sequentially stacked on the insulation layer 120. In some embodiments, the first front side bump 141 may include a copper (Cu) material and the second front side bump 142 may include a nickel (Ni) material. A solder layer 150 may be disposed on a surface of the front side bump 140 opposite to the chip body 110.

The first surface 111 of the chip body 110 may have an uneven profile. In the present embodiment, the first surface 111 of the chip body 110 may include a first region 111A and a third region 111C having a first horizontal level LV1, and a second region 111B having a second horizontal level LV2 which is lower than the first horizontal level LV1 by a height T1. In contrast, the second surface 112 of the chip body 110 may have a flat surface profile throughout. Thus, a thickness of the chip body 110 in the first and third regions 111A and 111C may be greater than a thickness of the chip body 110 in the second region 111B.

In some embodiments, the second region 111B may have a recess 116 corresponding to a trench or a groove. The second region 111B may be disposed between the first and third regions 111A and 111C. Thus, the second region 111B may surround the first region 111A and may be surrounded by the third region 111C when viewed from a plan view. There may be a level difference corresponding to the height T1 between the first and second regions 111A and 111B. Similarly, there may be a level difference corresponding to the height T1 between the second and third regions 111B and 111C. An end of the through electrode 114 may be exposed at the first surface 111 of the chip body 110. The exposed end of the through electrode 114 may be located in the first region 111A. The exposed end of the through electrode 114 may be spaced apart from an inner side of the second region 111B by a predetermined distance D.

A passivation layer 160 may be disposed on the first surface 111 of the chip body 110. The passivation layer 160 may have a thickness to obtain a surface profile which is substantially consistent with a surface profile of the first surface 111 of the chip body 110, or which preserves features on the first surface 111. In other words, the thickness of the passivation layer 160 may be less than the depth of recess 116 on first surface 111. When the thickness of passivation layer 160 is greater than the depth of recess 116, the passivation layer 160 fills the recess 116 so that it is not preserved.

In some embodiments, a thickness of the passivation layer 160 in the first and third regions 111A and 111C may be equal to a thickness of the passivation layer 160 in the second region 111B. Thus, even after the passivation layer 160 is formed, a surface level difference between the passivation layer 160 in the first and third regions 111A and 111C and the passivation layer 160 in the second region 111B may be substantially equal to the height T1 corresponding to a depth of the recess 116. Alternatively, a thickness of the passivation layer 160 in the first and third regions 111A and 111C may be different from a thickness of the passivation layer 160 in the second region 111B. In such an embodiment, a surface level difference between the passivation layer 160 in the first and third regions 111A and 111C and the passivation layer 160 in the second region 111B may be less than the height T1 corresponding to a depth of the recess 116.

In the first region 111A, the passivation layer 160 may be disposed on the first surface 111 of the chip body 110. In a boundary region between the first and second regions 111A and 111B, the passivation layer 160 may be disposed on an inner sidewall of the recess 116. In the second region 111B, the passivation layer 160 may be disposed on a bottom surface of the recess 116. In a boundary region between the second and third regions 111B and 111C, the passivation layer 160 may be disposed on an outer sidewall of the recess 116. In the third region 111C, the passivation layer 160 may be disposed on the first surface 111 of the chip body 110. The passivation layer 160 may include a first passivation layer 161 and a second passivation layer 162 which are sequentially stacked on the first surface 111 of the chip body 110. In some embodiments, the first and second passivation layers 161 and 162 may include an oxide layer and a nitride layer, respectively, or vice versa.

A backside bump 170 may be disposed on the passivation layer 160. The backside bump 170 may overlap with the first and second regions 111A and 111B of the chip body 110. In the first region 111A, the backside bump 170 may contact the end of the through electrode 114. In the second region 111B, the backside bump 170 may completely fill the recess 116. The backside bump 170 may laterally extend to overlap with a portion of the third region 111C. As a result, a contact area between the backside bump 170 and the passivation layer 160 may be greater by an area of the inner sidewall and the outer sidewall of the recess 116 compared with a flat first surface 111 without the recess 116.

The backside bump 170 may include a seed layer 171, a first backside bump 172, a second backside bump 173 and a third backside bump 174 which are sequentially stacked on the through electrode 114 and the passivation layer 160. In some embodiments, the first, second and third backside bumps 172, 173 and 174 may include a copper (Cu) material, a nickel (Ni) material and a gold (Au) material, respectively. The seed layer 171 may include a barrier metal layer.

Figure 3:
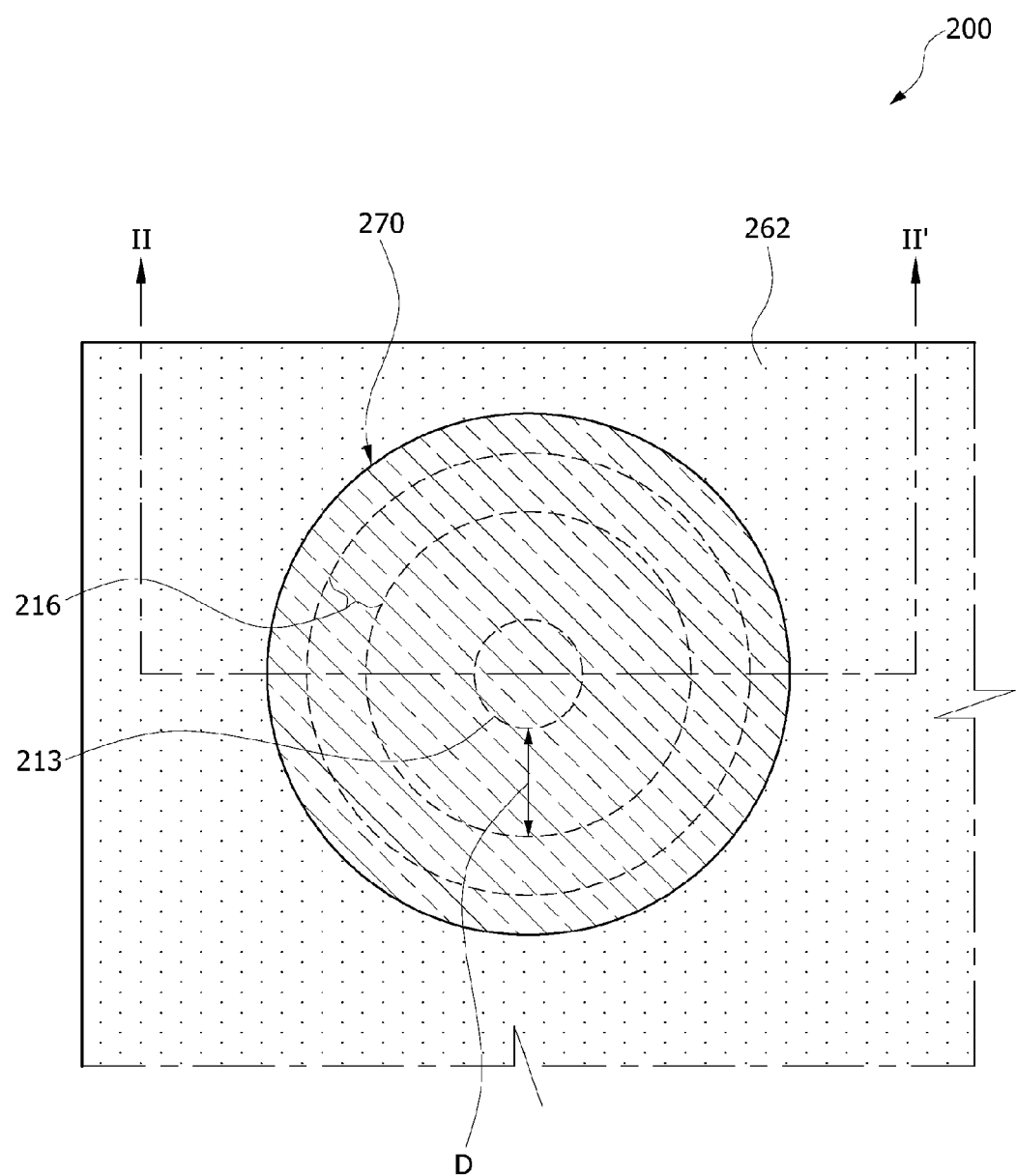
FIG. 3 is a plan view illustrating a portion of a semiconductor device according to another embodiment.
Figure 4:
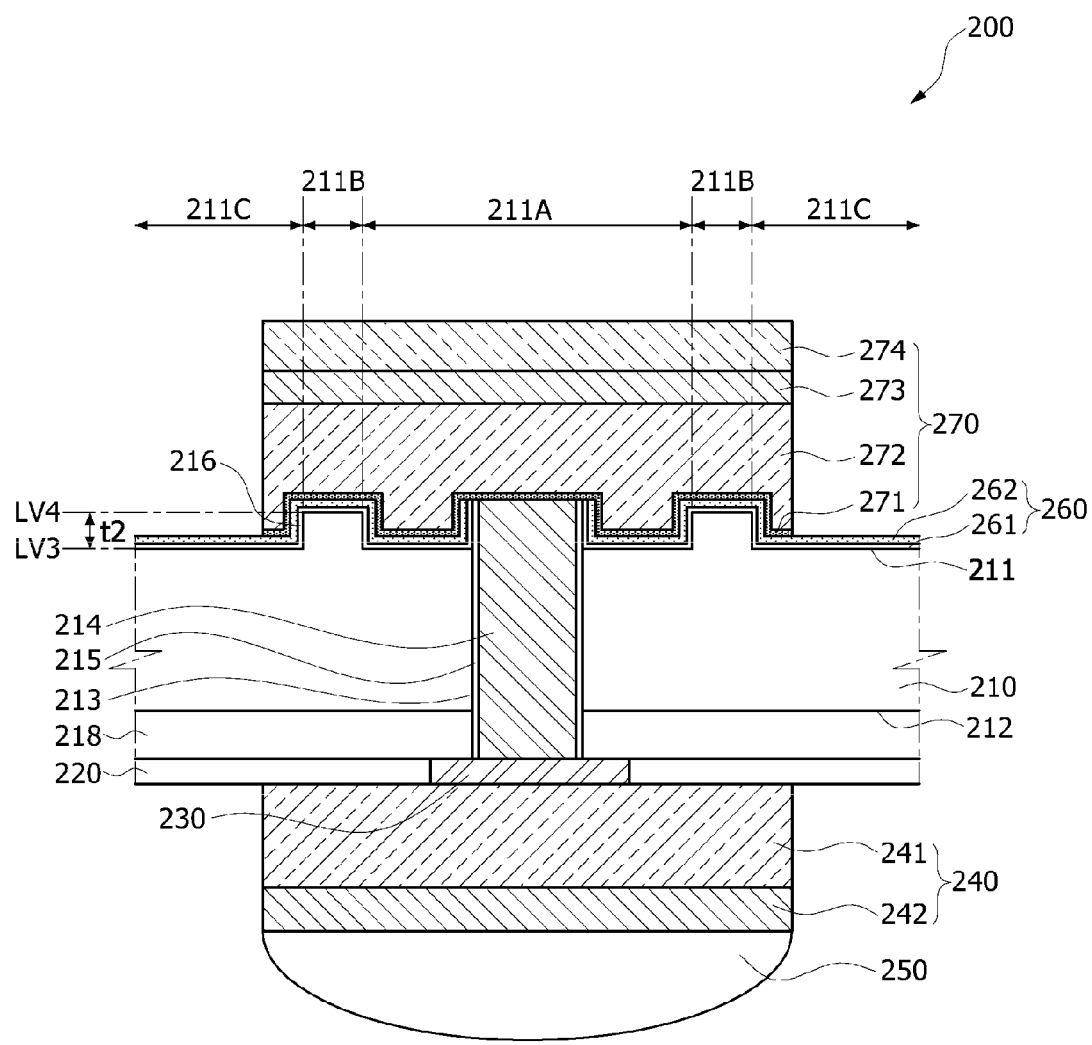
FIG. 4 is a cross-sectional view taken along line II-II' of FIG. 3.

FIG. 3 is a plan view illustrating a portion of a semiconductor device 200 according to another embodiment, and FIG. 4 is a cross-sectional view taken along a line II-II' of FIG. 3. Referring to FIGS. 3 and 4, the semiconductor device 200 may include a chip body 210 having a first surface 211 and a second surface 212. An active layer 218 may be disposed on the second surface 212 of the chip body 210. The first surface 211 of the chip body 210 may oppose the second surface 212 on which the active layer 218 is disposed. Although not shown in the drawings, circuit elements such as transistors and interconnection lines constituting integrated circuits may be disposed in the active layer 218.

A through electrode 214 may penetrate the chip body 210 and the active layer 218. The through electrode 214 may correspond to a TSV. The through electrode 214 may include a metal material such as a copper material or a copper alloy material containing copper and silicon. In some embodiments, the through electrode 214 may include a gallium (Ga) material, an indium (In) material, a tin (Sn) material, a silver (Ag) material, a mercury (Hg) material, a bismuth (Bi) material, a lead (Pb) material, a gold (Au) material, a zinc (Zn) material, an aluminum (Al) material, or an alloy containing at least two of these materials. The through electrode 214 may fill a though via hole 213 that penetrates the chip body 210 and the active layer 218. A diffusion barrier layer 215 may be disposed between the through electrode 214 and the chip body 210 as well as between the through electrode 214 and the active layer 218. The diffusion barrier layer 215 may prevent metal atoms in the through electrode 214 from being diffused into the chip body 210 and the active layer 218.

An end of the through electrode 214 may be exposed by a surface of the active layer 218 and contact a connection pad 230. The connection pad 230 may be disposed in an insulation layer 220 that covers a surface of the active layer 218 opposite to the chip body 210. A front side bump 240 may be disposed on a surface of the connection pad 230 opposite to the active layer 218. The front side bump 240 may include a first front side bump 241 and a second front side bump 242 which are sequentially stacked on the insulation layer 220. In some embodiments, the first front side bump 241 may include a copper (Cu) material and the second front side bump 242 may include a nickel (Ni) material. A solder layer 250 may be disposed on a surface of the front side bump 240 opposite to the chip body 210.

The first surface 211 of the chip body 210 may have an uneven profile. In the present embodiment, the first surface 211 of the chip body 210 includes a first region 211A and a third region 211C having a first horizontal level LV3 and a second region 211B having a second horizontal level LV4, which is higher than the first horizontal level LV3 by a height T2. In contrast, the second surface 212 of the chip body 210 may have a flat surface profile throughout. Thus, a thickness of the chip body 210 in the first and third regions 211A and 211C may be less than a thickness of the chip body 210 in the second region 211B. In some embodiments, the second region 211B may have a protrusion 216 that extends upwardly from the chip body 210 in the second regions 211B. The second region 211B may be disposed between the first and third regions 211A and 211C. Thus, the second region 211B may surround the first region 211A and may be surrounded by the third region 211C when viewed from a plan view. There may be a level difference corresponding to the height T2 between the first and second regions 211A and 211B. Similarly, there may be a level difference corresponding to the height T2 between the second and third regions 211B and 211C.

An end of the through electrode 214 may protrude from the first surface 211 of the chip body 210. Thus, a sidewall and a top surface of the end of the through electrode 214 may extend past the first surface 211 of the chip body 210. The exposed end of the through electrode 214 may be disposed in the first region 211A. In some embodiments, the top surface of the exposed end of the through electrode 214 may be substantially coplanar with a top surface of a passivation layer 260 formed on the protruded chip body 210 in the second region 211B. Thus, even in the first region 211A, there may be a level difference corresponding to a height of the exposed end of the through electrode 214 between the chip body 210 and the through electrode 214. The exposed end of the through electrode 214 may be spaced apart from an inner side of the second region 211B by a predetermined distance D.

The passivation layer 260 may be disposed on the first surface 211 of the chip body 210. The thickness of passivation layer 260 may result in a surface profile which is substantially consistent with a surface profile of the first surface 211 of the chip body 210. In some embodiments, a thickness of the passivation layer 260 in the first and third regions 211A and 211C may be equal to a thickness of the passivation layer 260 in the second region 211B. Thus, even after the passivation layer 260 is formed, a surface level difference between the passivation layer 260 in the first and third regions 211A and 211C and the passivation layer 260 in the second region 211B may be substantially equal to the height T2 corresponding to a height of the protrusion 216 of the chip body 210 in the second regions 211B. Alternatively, a thickness of the passivation layer 260 in the first and third regions 211A and 211C may be different from a thickness of the passivation layer 260 in the second region 211B. In such an embodiment, a surface level difference between the passivation layer 260 in the first and third regions 211A and 211C and the passivation layer 260 in the second region 211B may be less than the height T2 corresponding to a height of the protrusion 216 of the chip body 210.

In the first region 211A, the passivation layer 260 may be disposed on a sidewall of the protruding portion of the through electrode 214 and the first surface 211 of the chip body 210. In a boundary region between the first and second regions 211A and 211B, the passivation layer 260 may be disposed on an inner sidewall of the protrusion 216. In the second region 211B, the passivation layer 260 may be disposed on a top surface of the protrusion 216. In a boundary region between the second and third regions 211B and 211C, the passivation layer 260 may be disposed on an outer sidewall of the protrusion 216. In the third region 211C, the passivation layer 260 may be disposed on the first surface 211 of the chip body 210. The passivation layer 260 may include a first passivation layer 261 and a second passivation layer 262 which are sequentially stacked on the first surface 211 of the chip body 210. In some embodiments, the first and second passivation layers 261 and 262 may include an oxide layer and a nitride layer, respectively, or vice versa.

A backside bump 270 may be disposed on the passivation layer 260. The backside bump 270 may overlap with the first and second regions 211A and 211B of the chip body 210. In addition, the backside bump 270 may laterally extend to overlap with a portion of the third region 211C adjacent to the second region 211B. In the first region 211A, the backside bump 270 may contact the top surface of the protrusion of the through electrode 214 and may contact the passivation layer 260 disposed on the sidewall of the protrusion of the through electrode 214. In addition, the backside bump 270 may also contact the passivation layer 260 disposed on the inner sidewall and the outer sidewall of the protrusion 216 of the chip body 210. As a result, a contact area between the backside bump 270 and the passivation layer 260 is increased by an area of the inner sidewall and the outer sidewall of the protrusion 216 relative to a flat surface 211 without the protrusion 216.

The backside bump 270 may include a seed layer 271, a first backside bump 272, a second backside bump 273 and a third backside bump 274 which are sequentially stacked on the through electrode 214 and the passivation layer 260. In some embodiments, the first, second and third backside bumps 272, 273 and 274 may include a copper (Cu) material, a nickel (Ni) material and a gold (Au) material, respectively. The seed layer 271 may include a barrier metal layer.

Figure 5:
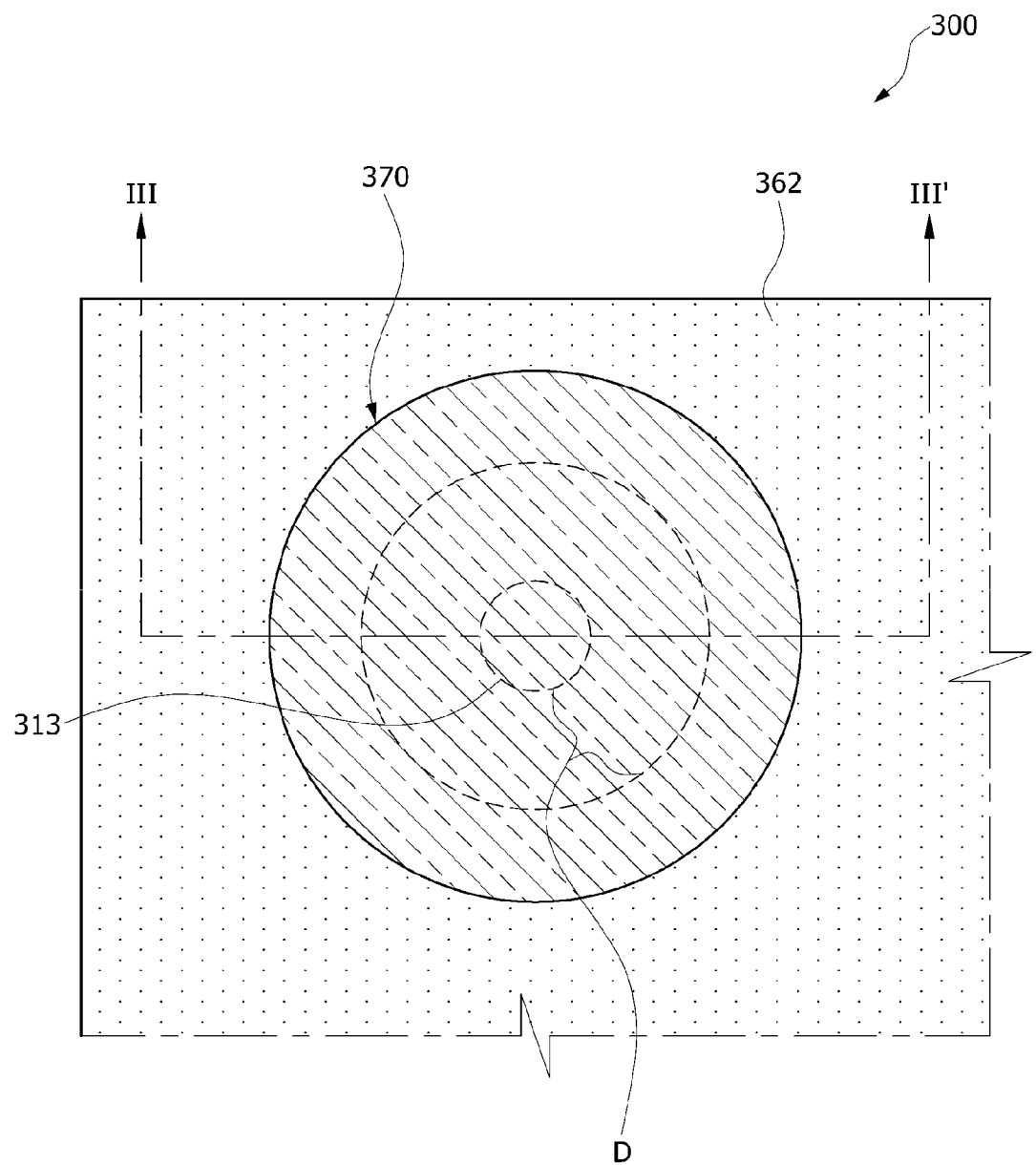
FIG. 5 is a plan view illustrating a portion of a semiconductor device according to yet another embodiment.
Figure 6:
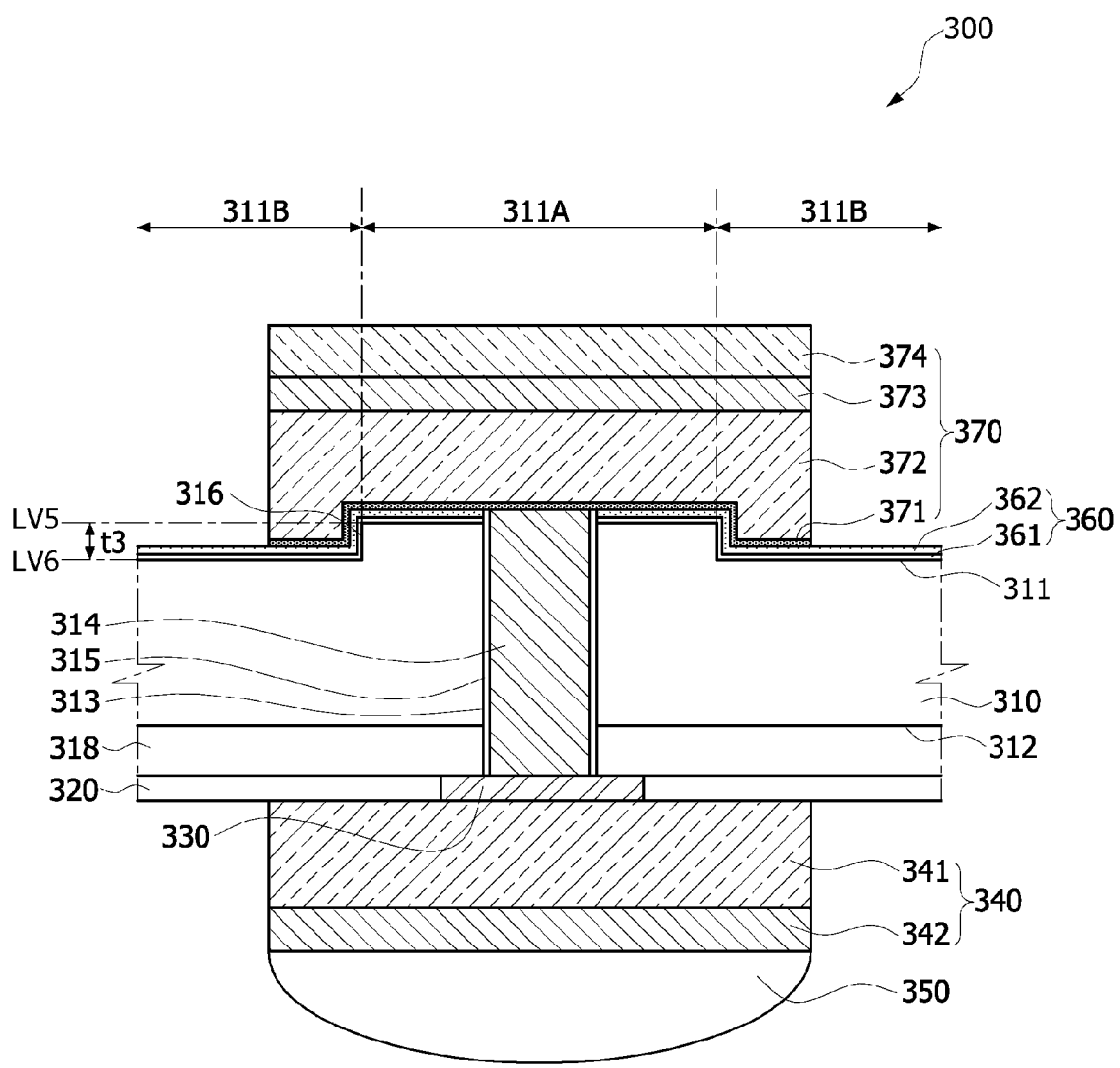
FIG. 6 is a cross-sectional view taken along line III-III' of FIG. 5.

FIG. 5 is a plan view illustrating a portion of a semiconductor device 300 according to yet another embodiment, and FIG. 6 is a cross-sectional view taken along a line III-III' of FIG. 5. Referring to FIGS. 5 and 6, the semiconductor device 300 may include a chip body 310 having a first surface 311 and a second surface 312. An active layer 318 may be disposed on the second surface 312 of the chip body 310. The first surface 311 of the chip body 310 may oppose the second surface 312 on which the active layer 318 is disposed. Although not shown in the drawings, circuit elements such as transistors and interconnection lines constituting integrated circuits may be disposed in the active layer 318.

A through electrode 314 may penetrate the chip body 310 and the active layer 318. The through electrode 314 may correspond to a TSV. The through electrode 314 may include a metal material such as a copper material or a copper alloy material containing copper and silicon. In some embodiments, the through electrode 314 may include a gallium (Ga) material, an indium (In) material, a tin (Sn) material, a silver (Ag) material, a mercury (Hg) material, a bismuth (Bi) material, a lead (Pb) material, a gold (Au) material, a zinc (Zn) material, an aluminum (Al) material, or an alloy containing at least two of these materials. The through electrode 314 may fill a though via hole 313 that penetrates the chip body 310 and the active layer 318. A diffusion barrier layer 315 may be disposed between the through electrode 314 and the chip body 310 as well as between the through electrode 314 and the active layer 318. The diffusion barrier layer 315 may prevent metal atoms in the through electrode 314 from being diffused into the chip body 310 and the active layer 318.

An end of the through electrode 314 may be exposed by the active layer 318 and contact a connection pad 330. The connection pad 330 may be disposed in an insulation layer 320 that covers a surface of the active layer 318 opposite to the chip body 310. A front side bump 340 may be disposed on a surface of the connection pad 330 opposite to the active layer 318. The front side bump 340 may include a first front side bump 341 and a second front side bump 342 which are sequentially stacked on the insulation layer 320. In some embodiments, the first front side bump 341 may include a copper (Cu) material and the second front side bump 342 may include a nickel (Ni) material. A solder layer 350 may be disposed on a surface of the front side bump 340 opposite to the chip body 310.

The first surface 311 of the chip body 310 may have an uneven profile. In the present embodiment, the first surface 311 of the chip body 310 may include a first region 311A having a first horizontal level LV5, and a second region 311B having a second horizontal level LV6, which is lower than the first horizontal level LV5 by a height T3. In contrast, the second surface 312 of the chip body 310 may have a flat surface profile throughout. Thus, a thickness of the chip body 310 in the first region 311A may be greater than a thickness of the chip body 310 in the second region 311B.

In some embodiments, the first region 311A may have a protrusion 316 that extends upwardly from the chip body 310 in the first regions 311A by the height T3. In some embodiments, the second region 311B may surround the first region 311A when viewed from a plan view. There may be a level difference corresponding to the height T3 between the first and second regions 311A and 311B.

An end of the through electrode 314 may be exposed at the first surface 311 of the chip body 310. The exposed end of the through electrode 314 may be located at a central portion of the first region 311A. In some embodiments, the through electrode 314 may protrude upwardly from the first surface 311 of the chip body 310 in the first region 311A. That is, the through electrode 314 may extend to penetrate a passivation layer 360 disposed on the first surface 311 of the chip body 310 in the first region 311A. In some embodiments, a top surface of the protruded end of the through electrode 314 may be substantially coplanar with a top surface of the passivation layer 360 formed on the first surface 311 of the chip body 310 in the first region 311A. The protruded end of the through electrode 314 may be spaced apart from a step on the first surface 311 corresponding to an inner side of the second region 311B by a predetermined distance D.

The passivation layer 360 may be disposed on the first surface 311 of the chip body 310. The thickness of passivation layer 360 may result in a surface profile which is substantially consistent with a surface profile of the first surface 311 of the chip body 310. In some embodiments, a thickness of the passivation layer 360 in the first region 311A may be equal to a thickness of the passivation layer 360 in the second region 311B. Thus, even after the passivation layer 360 is formed, a surface level difference between the passivation layer 360 in the first region 311A and the passivation layer 360 in the second region 311B may be substantially equal to the height T3 corresponding to a height of the protrusion 316 of the chip body 310 in the first region 311A. Alternatively, a thickness of the passivation layer 360 in the first region 311A may be different from a thickness of the passivation layer 360 in the second region 311B. In such an embodiment, a surface level difference between the passivation layer 360 in the first region 311A and the passivation layer 360 in the second region 311B may be different from the height T3 corresponding to a height of the protrusion 316 of the chip body 310.

In the first region 311A, the passivation layer 360 may be disposed on the first surface 311 of the chip body 310. In a boundary region between the first and second regions 311A and 311B, the passivation layer 360 may be disposed on a sidewall of the protrusion 316. In the second region 311B, the passivation layer 360 may be disposed on the first surface 311 of the chip body 310. The passivation layer 360 may include a first passivation layer 361 and a second passivation layer 362 which are sequentially stacked on the first surface 311 of the chip body 310. In some embodiments, the first and second passivation layers 361 and 362 may include an oxide layer and a nitride layer, respectively, or vice versa.

A backside bump 370 may be disposed on the passivation layer 360. The backside bump 370 may overlap with the first region 311A of the chip body 310. That is, the backside bump 370 may contact the top surface of the through electrode 314. In addition, the backside bump 370 may laterally extend to overlap with a portion of the second region 311B adjacent to the first region 311B. Thus, the backside bump 370 may also contact the passivation layer 360 disposed on the sidewall of the protrusion 316 of the chip body 310 in the first region 311A. As a result, a contact area between the backside bump 370 and the passivation layer 360 is greater by an area of the sidewall of the protrusion 316 than a flat first surface 311 of the chip body 310 without the protrusion 316.

The backside bump 370 may include a seed layer 371, a first backside bump 372, a second backside bump 373 and a third backside bump 374 which are sequentially stacked on the through electrode 314 and the passivation layer 360. In some embodiments, the first, second and third backside bumps 372, 373 and 374 may include a copper (Cu) material, a nickel (Ni) material and a gold (Au) material, respectively. The seed layer 371 to include a barrier metal layer.

Figure 7:
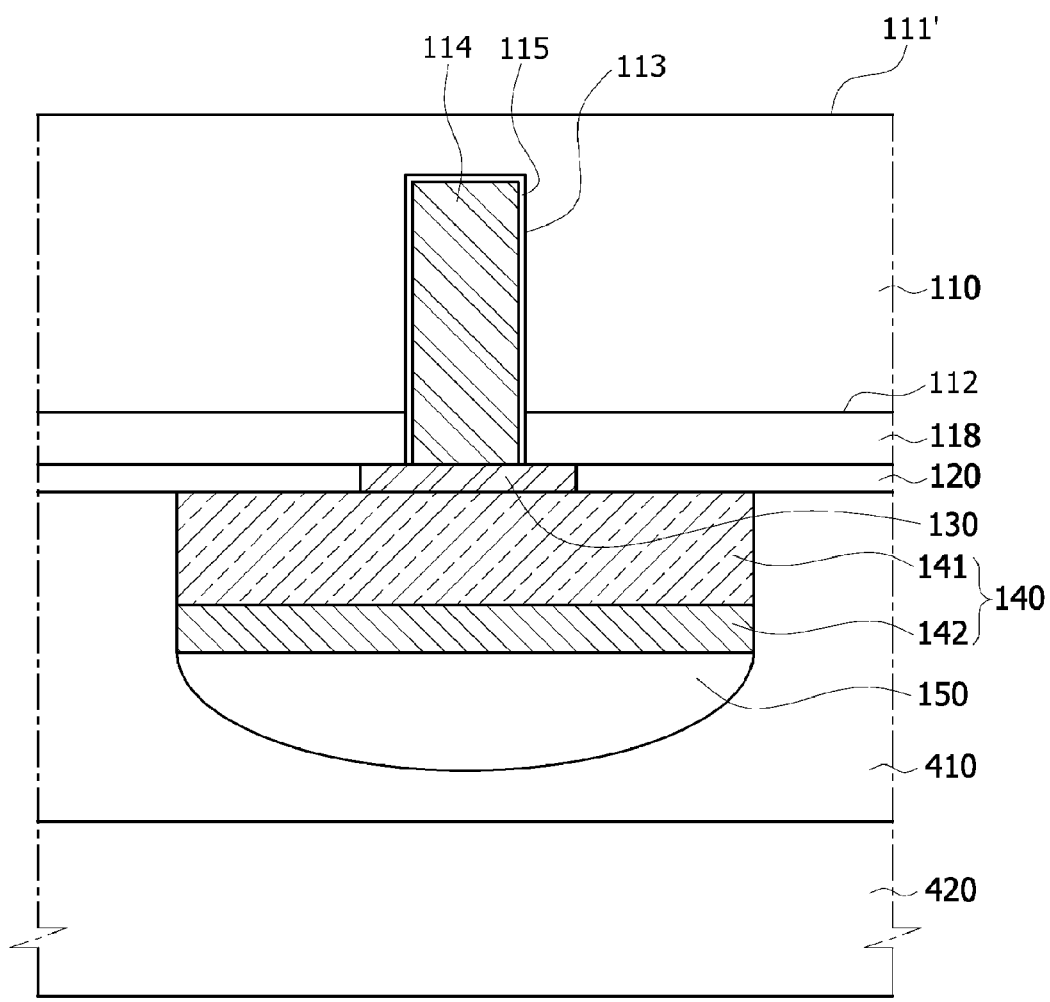
FIGS. 7 to 14 are cross-sectional views illustrating a method of fabricating a semiconductor device according to an embodiment.

FIGS. 7 to 14 are cross-sectional views illustrating a method of fabricating a semiconductor device according to an embodiment. Referring to FIG. 7, a chip body 110 having a second surface 112 and a third surface 111' may be provided. The third surface 111' may correspond to an initial backside surface of the chip body 110 and may oppose the second surface 112 corresponding to a front side surface. An active layer 118 may be formed on the second surface 112 of the chip body 110. The active layer 118 may include an insulation layer that covers circuit elements such as transistors and interconnection lines constituting integrated circuits.

A through electrode 114 may penetrate the active layer 118 and extend into the chip body 110 toward the third surface 111'. An end of the through electrode 114 may be exposed at a surface of the active layer 118. In order to form the through electrode 114, a via hole 113 having a predetermined depth may penetrate the active layer 118 and extend into the chip body 110. A diffusion barrier layer 115 may be formed on a sidewall and a bottom surface of the via hole 113. A conductive layer such as a copper layer may fill the via hole 113 surrounded by the diffusion barrier layer 115. As a result, the through electrode 114 may be formed in the via hole 113.

A connection pad 130 may be formed on the exposed end of the through electrode 114. The connection pad 130 may be formed in an opening of an insulation layer 120 deposited on a surface of the active layer 118 opposite to the chip body 110. A front side bump 140 may contact the connection pad 130. Forming the front side bump 140 may include forming a first front side bump 141 and forming a second front side bump 142 which are sequentially stacked on a surface of the connection pad 130 opposite to the through electrode 114. The first and second front side bumps 141 and 142 may be formed of a copper (Cu) layer and a nickel (Ni) layer, respectively. A solder layer 150 may be formed on a surface of the front side bump 140 opposite to the connection pad 130. The solder layer 150, the insulation layer 120 and the front side bump 140 may be attached to an auxiliary substrate 420 such as a carrier substrate using an adhesive layer 410. Accordingly, the third surface 111' of the chip body 110 may still be exposed even after the chip body 110 is attached to the auxiliary substrate 420.

Figure 8:
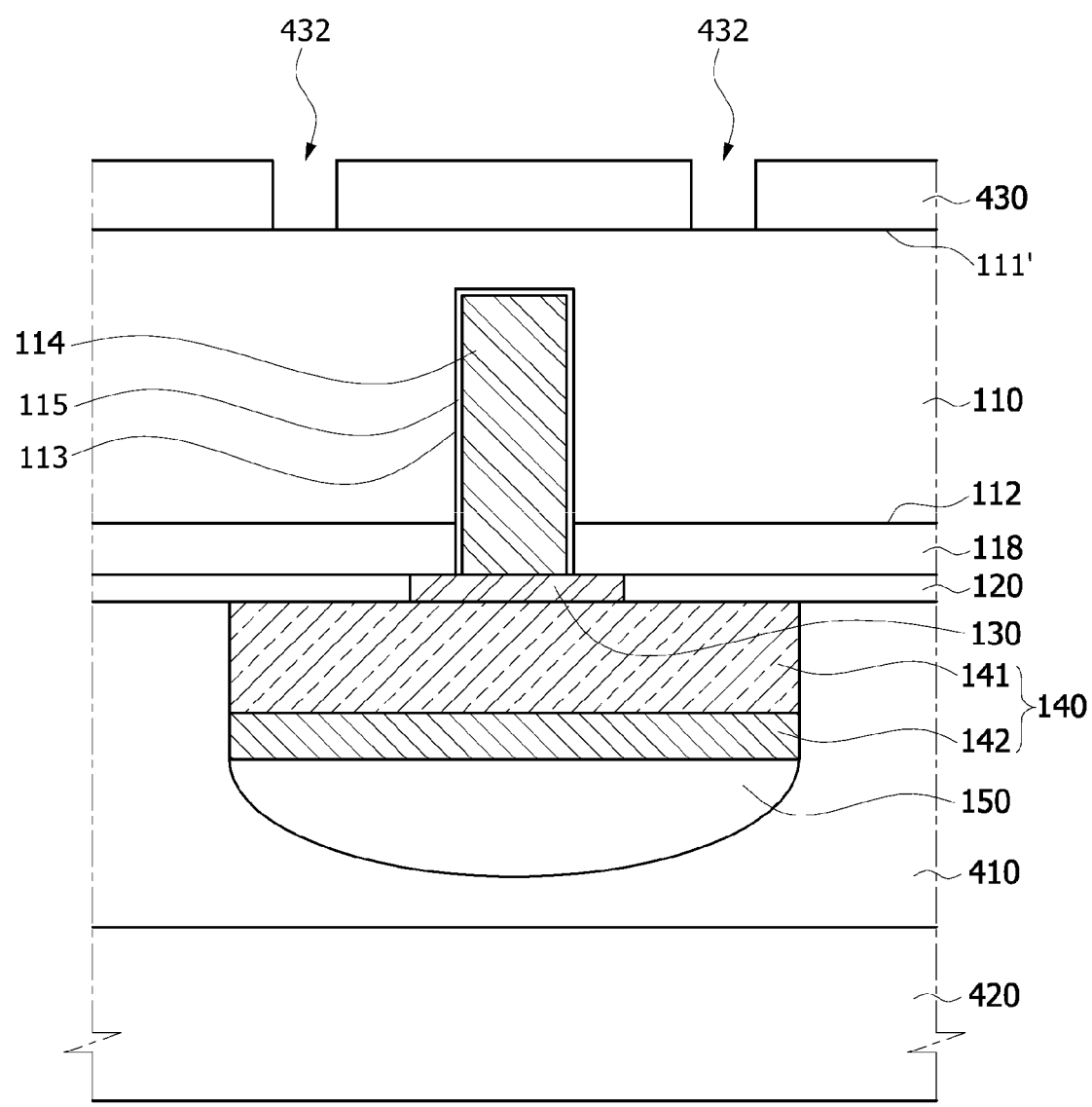

Referring to FIG. 8, an etch buffer layer 430 may be formed on the third surface 111' of the chip body 110. The etch buffer layer 430 may be patterned to form an opening 432 that exposes a portion of the third surface 111' of the chip body 110. The opening 432 may have an annular shape. A central portion of the etch buffer layer 430 surrounded by the opening 432 may overlap with the through electrode 114. In some embodiments, the etch buffer layer 430 may be formed of a material having a low etch selectivity with respect to the chip body 110.

Figure 9:
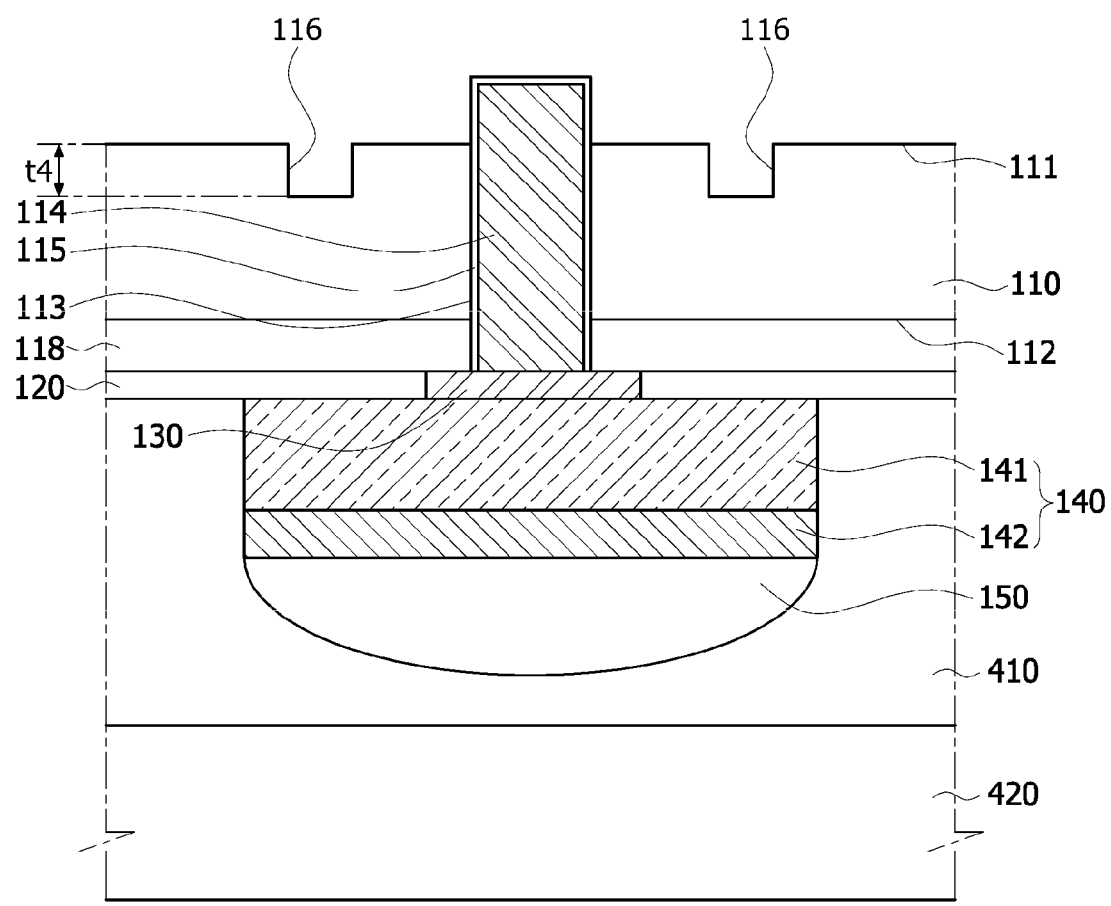

Referring to FIG. 9, an etch process may be applied to the etch buffer layer 430 and the chip body 110. While the etch process is performed, portions of the chip body 110 exposed by the opening 432 may be etched and the etch buffer layer 430 may also be etched away to expose the chip body 110 under the etch buffer layer 430. The etch process may be continuously performed until an end of the through electrode 114 is exposed. As a result, the chip body 110 may be etched to have a first surface 111 with an uneven surface profile including a recess 116 corresponding to the opening 432 of FIG. 8. The end of the through electrode 114 may protrude from the first surface 111 of the chip body 110. The recess 116 may have a depth T4.

Figure 10:
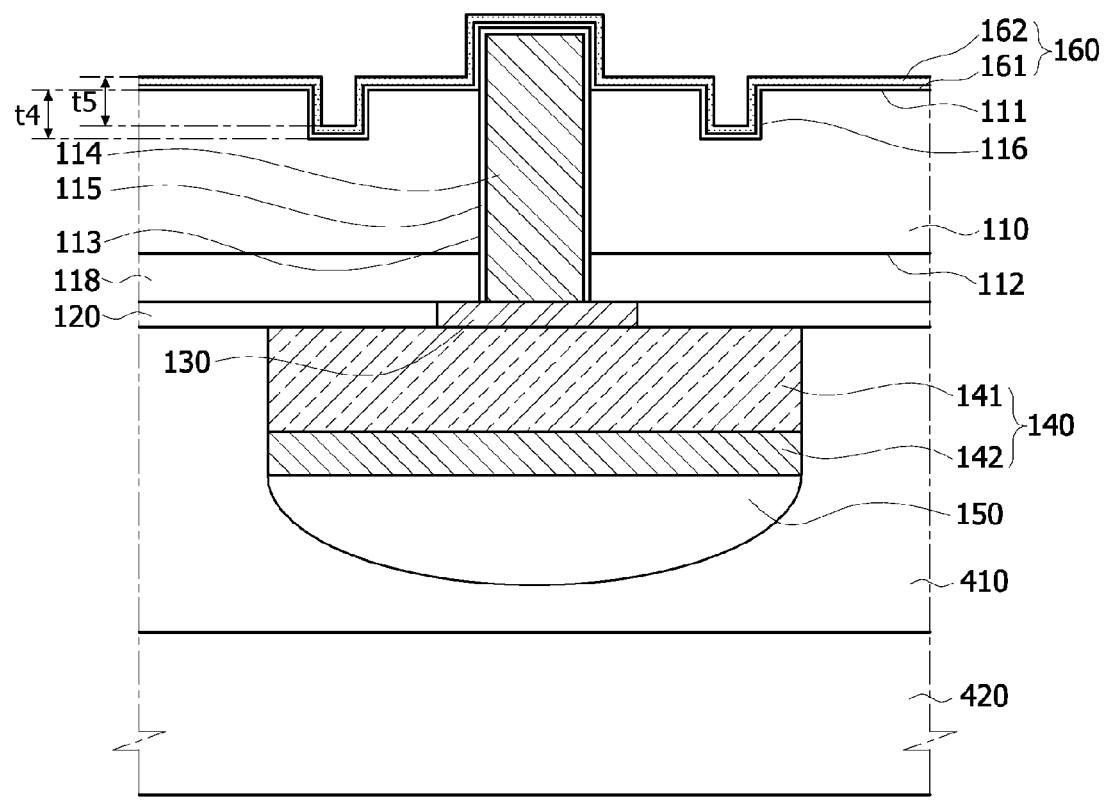

Referring to FIG. 10, a passivation layer 160 may cover the first surface 111 of the chip body 110 and the protruded end of the through electrode 114. The passivation layer 160 may be formed by sequentially stacking a first passivation layer 161 and a second passivation layer 162. The first and second passivation layers 161 and 162 may be formed of an oxide layer and a nitride layer, respectively. A thickness of the passivation layer 160 may appropriate to obtain a surface profile that is substantially consistent with a surface profile of the first surface 111 of the chip body 110. Thus, there may be a level difference T5 between a portion of the passivation layer 160 disposed on a bottom surface of recess 116 and portions of passivation layer 160 adjacent to recess 116. The level difference T5 may be substantially equal to the depth T4 of the recess 116.

Figure 11:
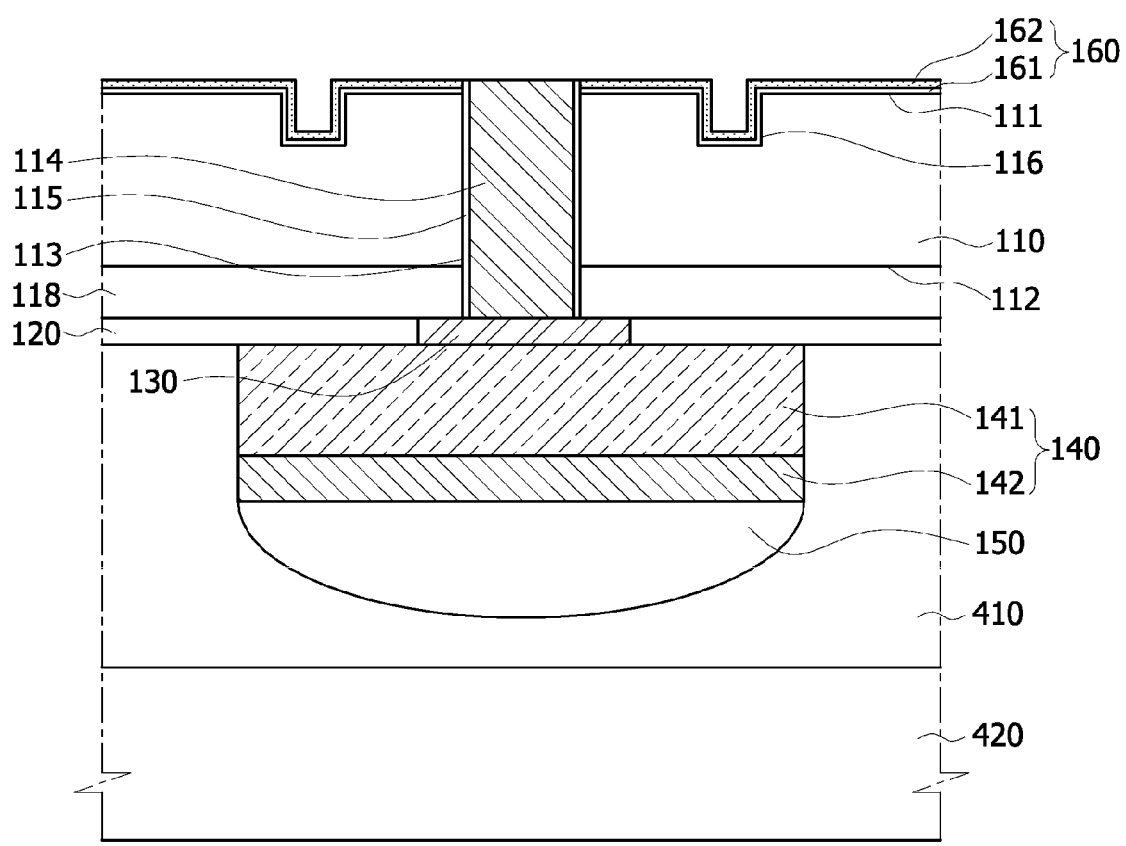

Referring to FIG. 11, a planarization process may be applied to the protruded end of the through electrode 114. The planarization process may be performed using a chemical mechanical polishing (CMP) technique. The planarization process may use the passivation layer 160 on the first surface 111 of the chip body 110 as a CMP stopper. As a result, a top surface of the planarized through electrode 114 may be coplanar with a top surface of the passivation layer 160 on the first surface 111 of the chip body 110.

Figure 12:
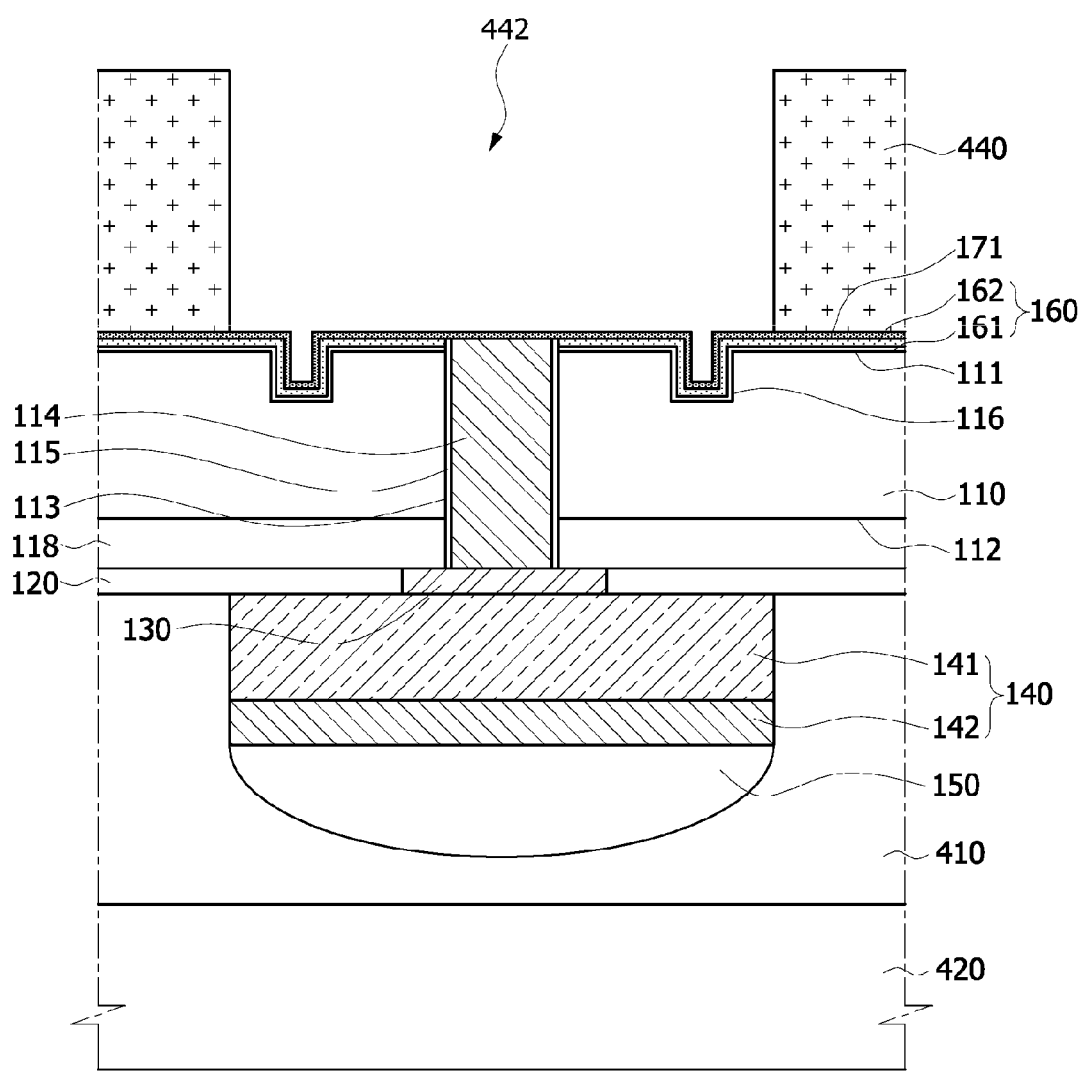

Referring to FIG. 12, a seed layer 171 may be formed on the passivation layer 160 and the planarized through electrode 114. The seed layer 171 may include a barrier metal layer. In some embodiments, the seed layer 171 may be formed of a copper (Cu) layer. The seed layer 171 may be conformably formed on the passivation layer 160 to have a surface profile that is substantially consistent with a surface profile of the passivation layer 160 in the recess 116. Thus, a contact area between the seed layer 171 and the passivation layer 160 may increase as compared with a flat first surface 111 without the recess 116. Accordingly, an adhesive strength between the seed layer 171 and the passivation layer 160 may be improved. A mask pattern 440 having an opening 442 may be formed on the seed layer 171. In some embodiments, the mask pattern 440 may be a photoresist layer. The opening 442 of the mask pattern 440 may expose a portion of the seed layer 171 on the through electrode 114 and a portion of the seed layer 171 on the recess 116.

Figure 13:
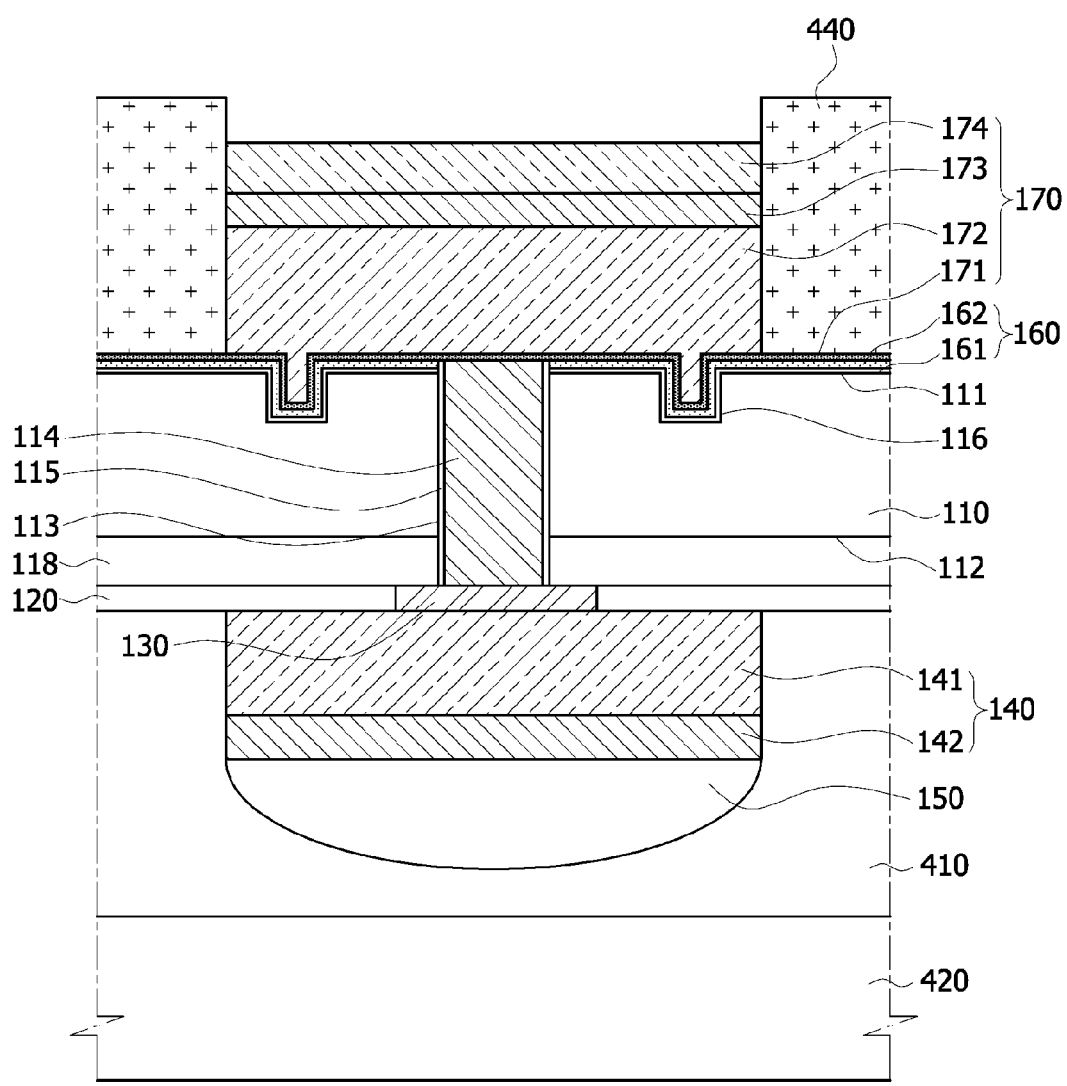

Referring to FIG. 13, a first backside bump 172, a second backside bump 173 and a third backside bump 174 may be sequentially formed on the seed layer 171 exposed by the opening 442 using a plating process. In some embodiments, the first backside bump 172, the second backside bump 173 and the third backside bump 174 may be formed of a copper (Cu) material, a nickel (Ni) material and a gold (Au) material, respectively. Subsequently, the mask pattern 440 may be removed to expose a portion of the seed layer 171.

Figure 14:
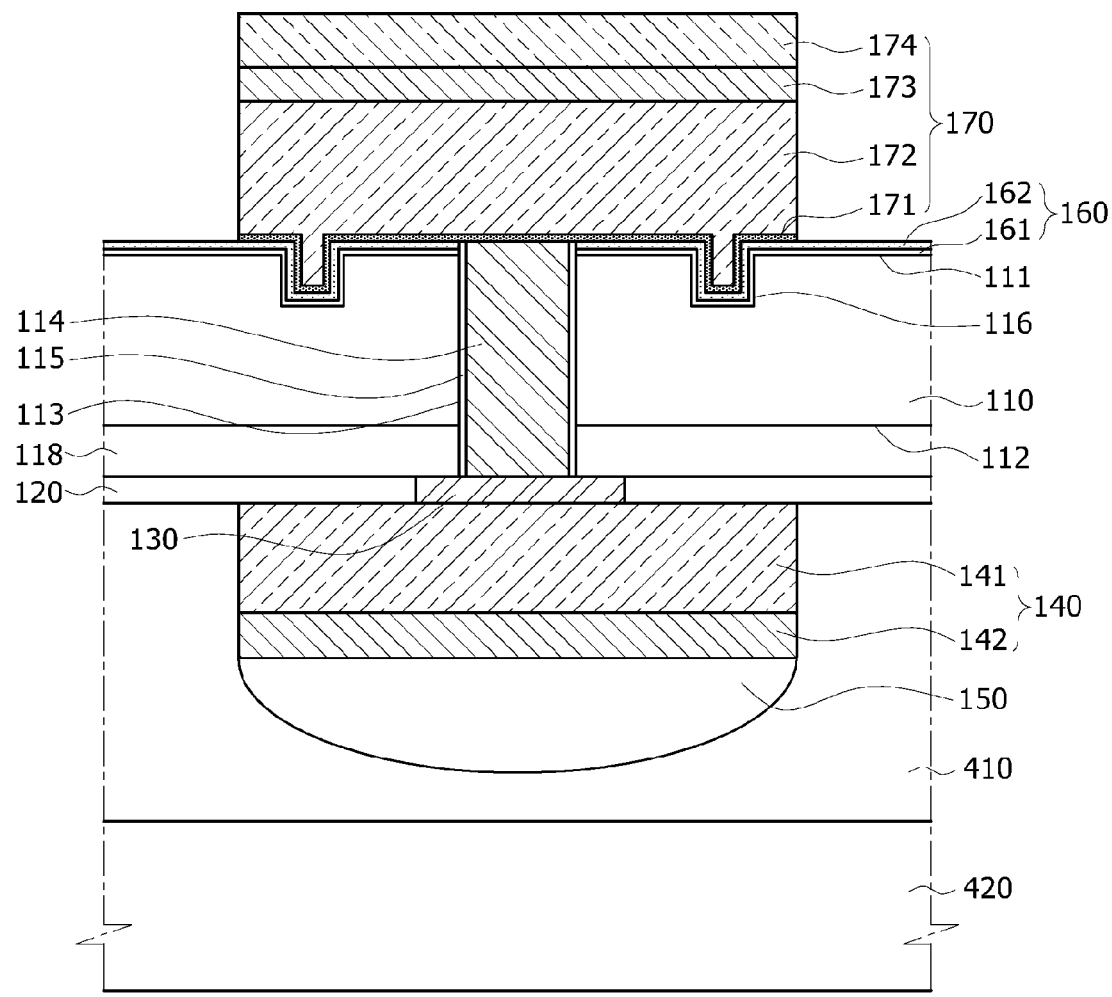

Referring to FIG. 14, the exposed portion of the seed layer 171 may be removed to form a patterned seed layer 171 that remains under the first backside bump 172. The patterned seed layer 171, first backside bump 172, the second backside bump 173 and the third backside bump 174 may constitute a backside bump 170. The exposed portion of the seed layer 171 may be removed using a wet etch process.

Figure 15:
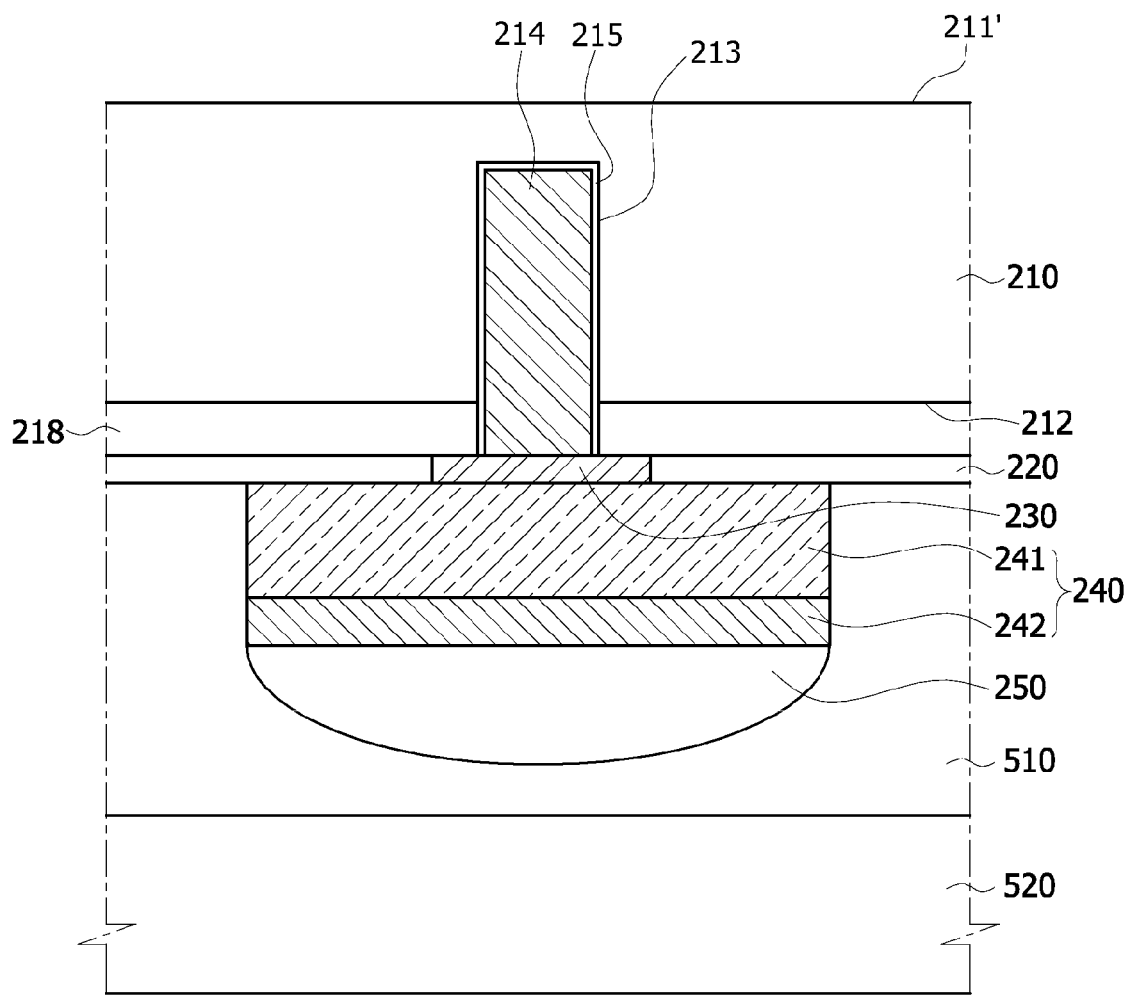
FIGS. 15 to 22 are cross-sectional views illustrating a method of fabricating a semiconductor device according to another embodiment.

FIGS. 15 to 22 are cross-sectional views illustrating a method of fabricating a semiconductor device according to another embodiment. Referring to FIG. 15, a chip body 210 having a second surface 212 and a third surface 211' may be provided. The third surface 211' may correspond to an initial backside surface of the chip body 210 and may oppose the second surface 212 corresponding to a front side surface. An active layer 218 may be formed on the second surface 212 of the chip body 210. The active layer 218 may include an insulation layer that covers circuit elements such as transistors and interconnection lines constituting integrated circuits.

A through electrode 214 may penetrate the active layer 218 and extend into the chip body 210 towards the third surface 211'. An end of the through electrode 214 may be exposed at a surface of the active layer 218. In order to form the through electrode 214, a via hole 213 having a predetermined depth may penetrate the active layer 218 and extend into the chip body 210. A diffusion barrier layer 215 may be formed on a sidewall and a bottom surface of the via hole 213. A conductive layer such as a copper layer may fill the via hole 213 surrounded by the diffusion barrier layer 215. As a result, the through electrode 214 may be formed in the via hole 213.

A connection pad 230 may be formed on the exposed end of the through electrode 214. The connection pad 230 may be formed in an opening of an insulation layer 220 deposited on a surface of the active layer 218 opposite to the chip body 210. A front side bump 240 may be in contact with the connection pad 230. The front side bump 240 may include a first front side bump 241 and a second front side bump 242 which are sequentially stacked on a surface of the connection pad 230 opposite to the through electrode 214. The first and second front side bumps 241 and 242 may be formed of a copper (Cu) layer and a nickel (Ni) layer, respectively. A solder layer 250 may be formed on a surface of the front side bump 240 opposite to the connection pad 230. The solder layer 250, the insulation layer 220 and the front side bump 240 may be attached to an auxiliary substrate 520 such as a carrier substrate using an adhesive layer 510. Accordingly, the third surface 211' of the chip body 210 may still be exposed even after the chip body 210 is attached to the auxiliary substrate 520.

Figure 16:
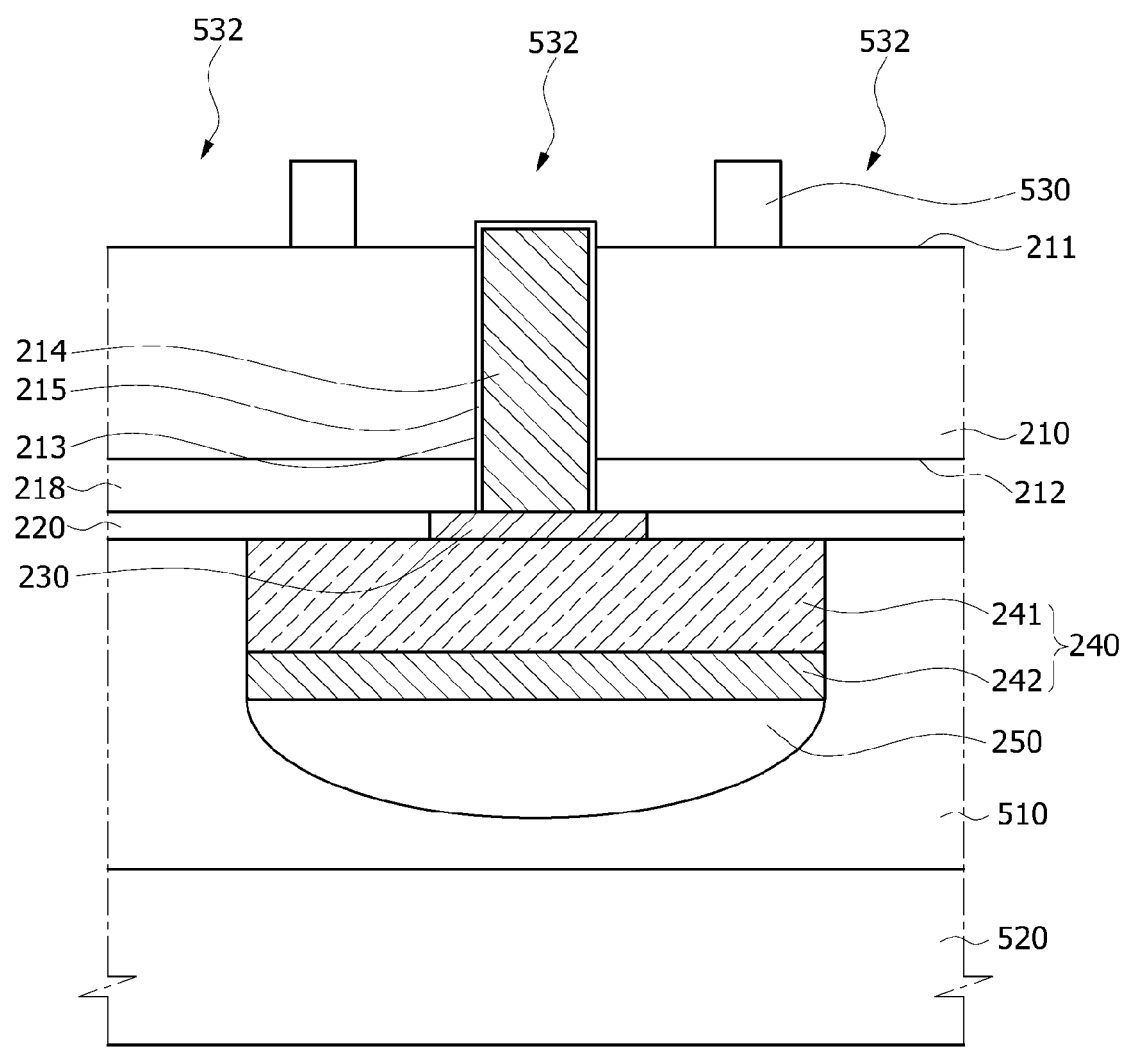

Referring to FIG. 16, a blanket etch process may be applied to the third surface (211' of FIG. 15) of the chip body 210. The blanket etch process may be performed using an etch-back technique. As a result of the blanket etch process, the chip body 210 may be etched to have a first surface 211, and an end of the through electrode 214 and a portion of the diffusion barrier layer 213 on the end of the through electrode 214 may protrude from the first surface 211 of the chip body 210. An etch buffer layer 530 may be formed on the first surface 211 of the chip body 210. The etch buffer layer 530 may be patterned to form openings 532 that expose portions of the diffusion barrier layer 215 on the protruded end of the through electrode 214 and edges of the first surface 211 of the chip body 210. The patterned etch buffer layer 530 may have an annular shape. The exposed diffusion barrier layer 215 may be surrounded by the patterned etch buffer layer 530 when viewed from a plan view. In some embodiments, the etch buffer layer 530 may be formed of a material having a low etch selectivity with respect to the chip body 210.

Figure 17:
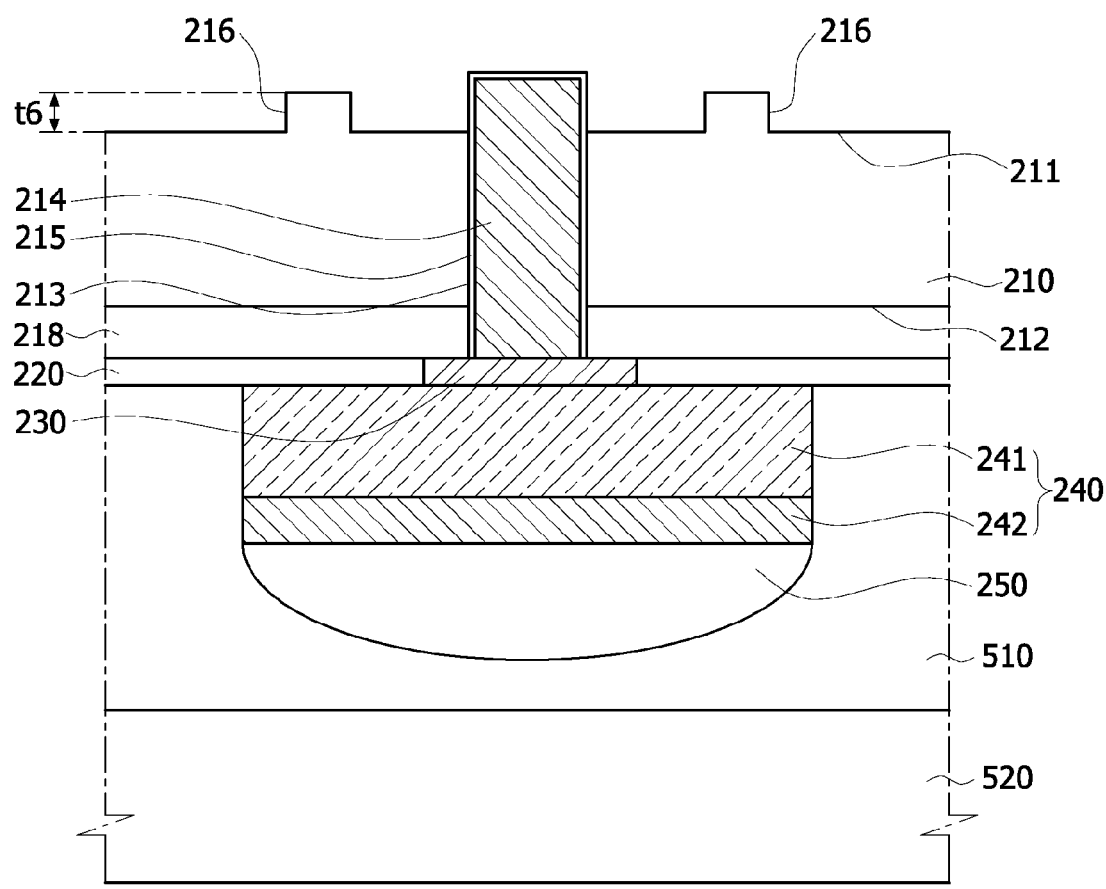

Referring to FIG. 17, an etch process may be applied to the etch buffer layer 530 and the chip body 210. While the etch process is performed, the chip body 210 exposed by the opening 532 may be etched and the etch buffer layer 530 may also be etched away to expose portions of the chip body 210 under the etch buffer layer 530. As a result of the etch process, a protrusion 216 of the chip body 210 may be formed which corresponds to the etch buffer layer 530 which is removed by the etch process. The protrusion 216 may have a height T6. In some embodiments, an etch process may be controlled such that an etch rate of the etch buffer layer 530 is higher than an etch rate of the chip body 210. In such an embodiment, the height T6 of the protrusion 216 may be less than a thickness of the etch buffer layer 530.

Figure 18:
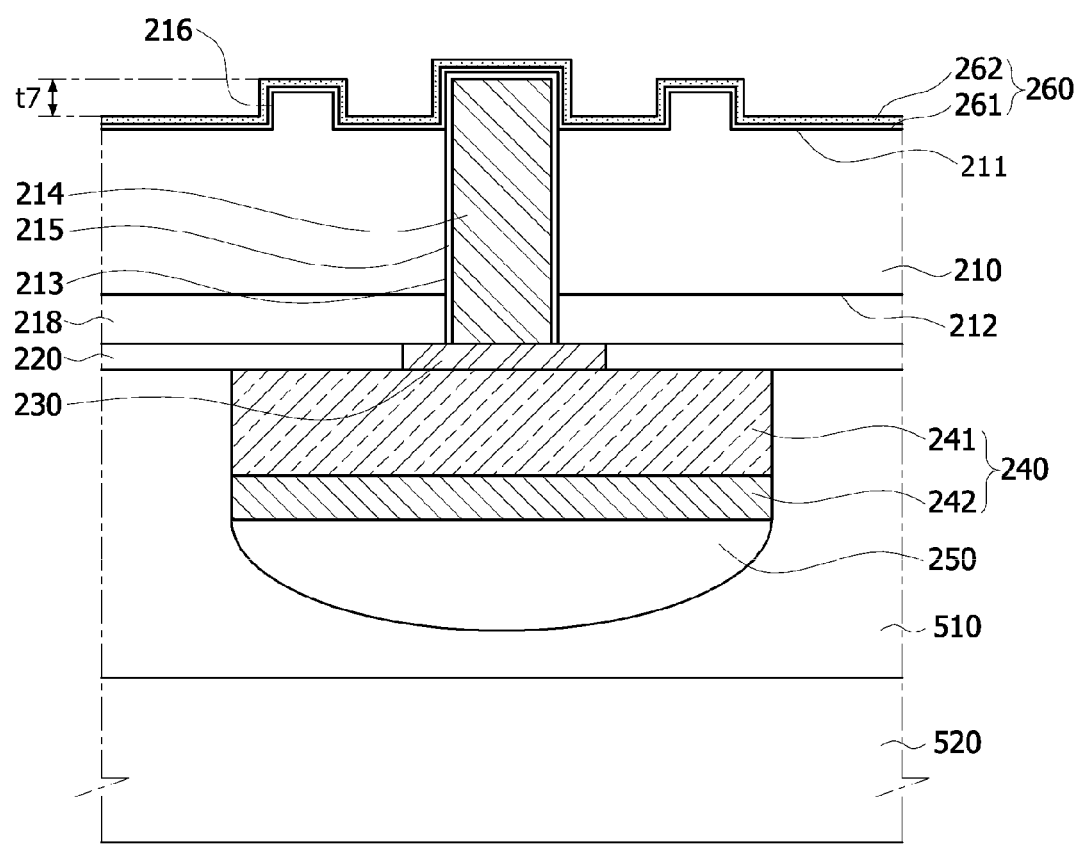

Referring to FIG. 18, a passivation layer 260 may cover the first surface 211 of the chip body 210 having the protrusion 216 and the exposed diffusion barrier layer 215 on the protruded end of the through electrode 214. The passivation layer 260 may be formed by sequentially stacking a first passivation layer 261 and a second passivation layer 262. The first and second passivation layers 261 and 262 may be formed of an oxide layer and a nitride layer, respectively. The thickness of passivation layer 260 may be appropriate to obtain a surface profile that is substantially consistent with a surface profile of the first surface 211 of the chip body 210. Thus, there may be a level difference T7 between the passivation layer 260 on a top surface of the protrusion 216 and the passivation layer 260 on the first surface 211 other than the protrusion 216, and the level difference T7 may be substantially equal to the height T6 of the protrusion 216.

Figure 19:
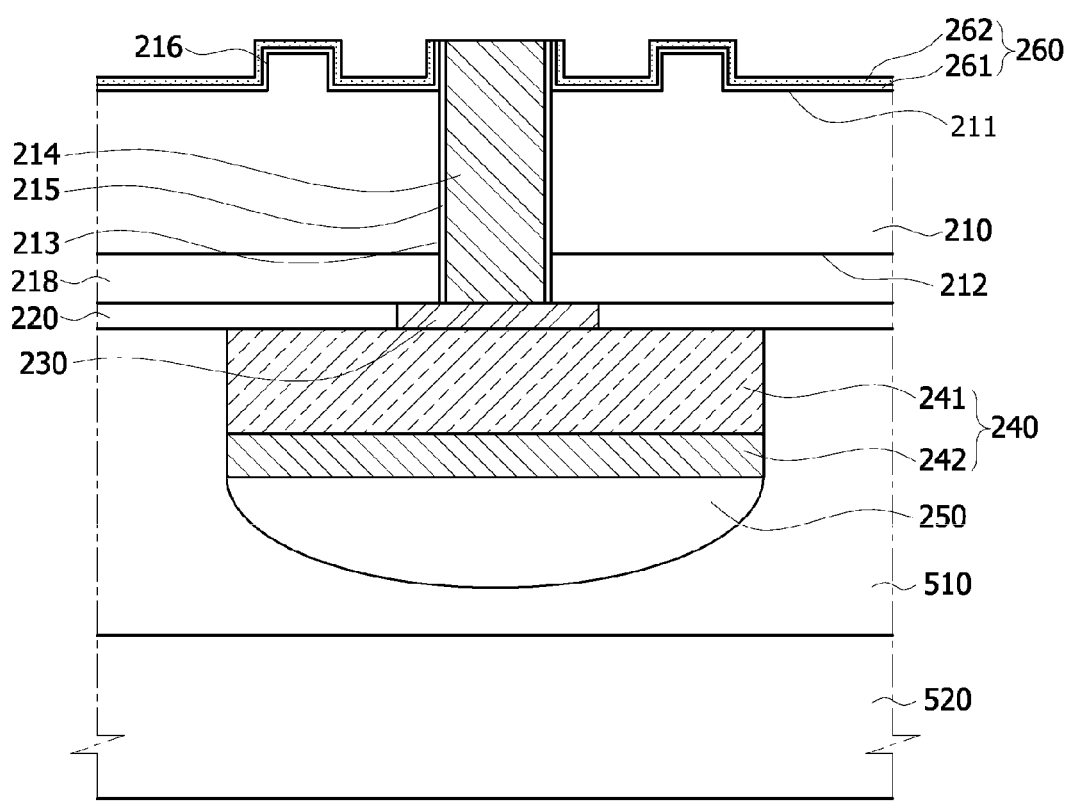

Referring to FIG. 19, a planarization process may be applied to the protruded end of the through electrode 214. The planarization process may be performed using a chemical mechanical polishing (CMP) technique. The planarization process may be performed using the passivation layer 260 on the top surface of the protrusion 216 as a CMP stopper. As a result, a top surface of the planarized through electrode 214 may be coplanar with a top surface of the passivation layer 260 on the top surface of the protrusion 216.

Figure 20:
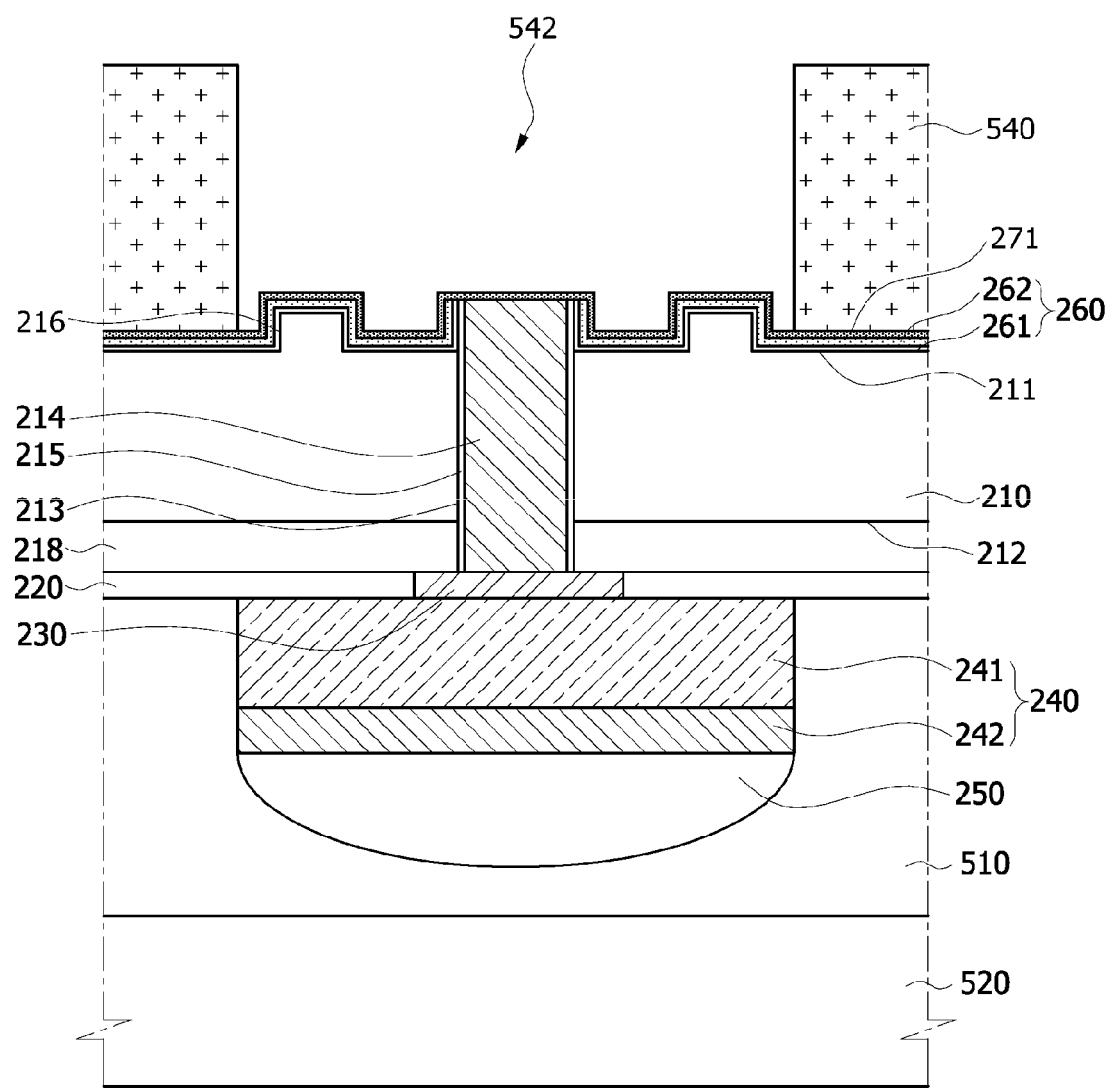

Referring to FIG. 20, a seed layer 271 may be formed on the passivation layer 260 and the planarized through electrode 214. The seed layer 271 may include a barrier metal layer. In some embodiments, the seed layer 271 may be formed of a copper (Cu) layer. The seed layer 271 may be conformably formed on the passivation layer 260 to have a surface profile that is substantially consistent with a surface profile of the passivation layer 260 on the protrusion 216. Thus, a contact area between the seed layer 271 and the passivation layer 260 is greater than a flat first surface 211 without the protrusion 216. Accordingly, an adhesive strength between the seed layer 271 and the passivation layer 260 may be improved. A mask pattern 540 having an opening 542 may be formed on the seed layer 271. In some embodiments, the mask pattern 540 may be formed of a photoresist layer. The opening 542 of the mask pattern 540 may expose a portion of the seed layer 271 on the through electrode 214 and a portion of the seed layer 271 on the protrusion 216.

Figure 21:
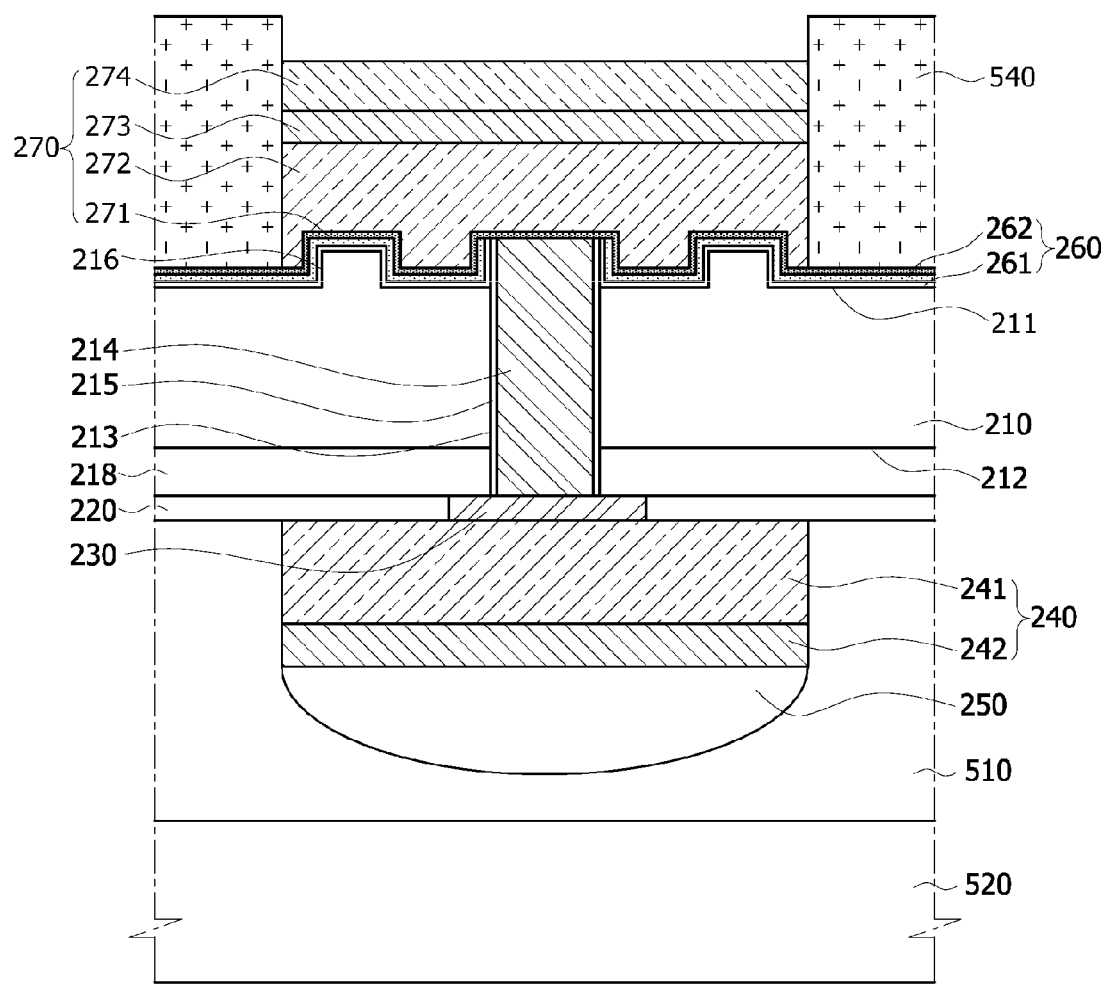

Referring to FIG. 21, a first backside bump 272, a second backside bump 273 and a third backside bump 274 may be sequentially formed on a portion of the seed layer 271 exposed by the opening 542 using a plating process. In some embodiments, the first backside bump 272, the second backside bump 273 and the third backside bump 274 may be formed of a copper (Cu) material, a nickel (Ni) material and a gold (Au) material, respectively. Subsequently, the mask pattern 540 may be removed to expose a portion of the seed layer 271.

Figure 22:
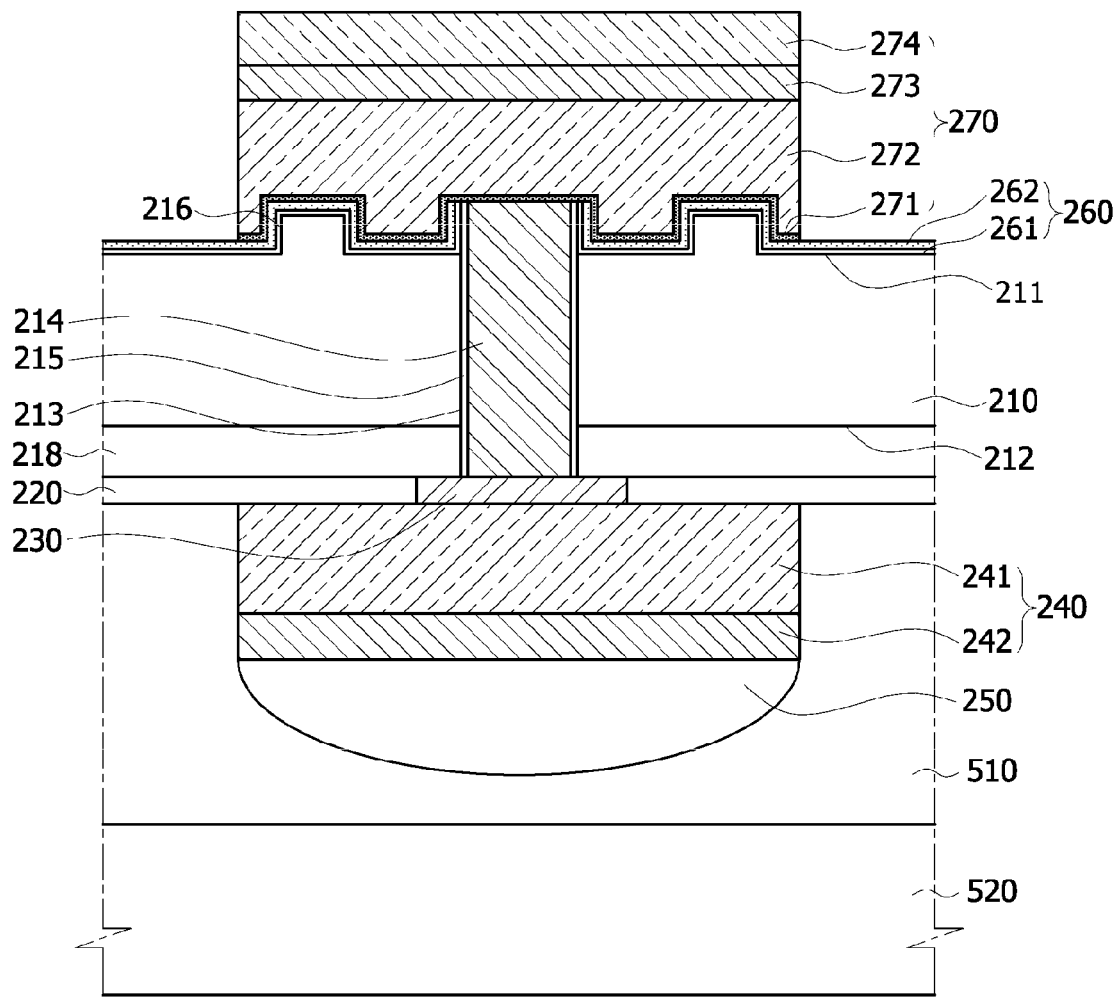

Referring to FIG. 22, the exposed portion of the seed layer 271 may be removed to form a patterned seed layer 271 that remains under the first backside bump 272. The patterned seed layer 271, first backside bump 272, the second backside bump 273 and the third backside bump 274 may constitute a backside bump 270. The exposed portion of the seed layer 271 may be removed using a wet etch process.

Figure 23:
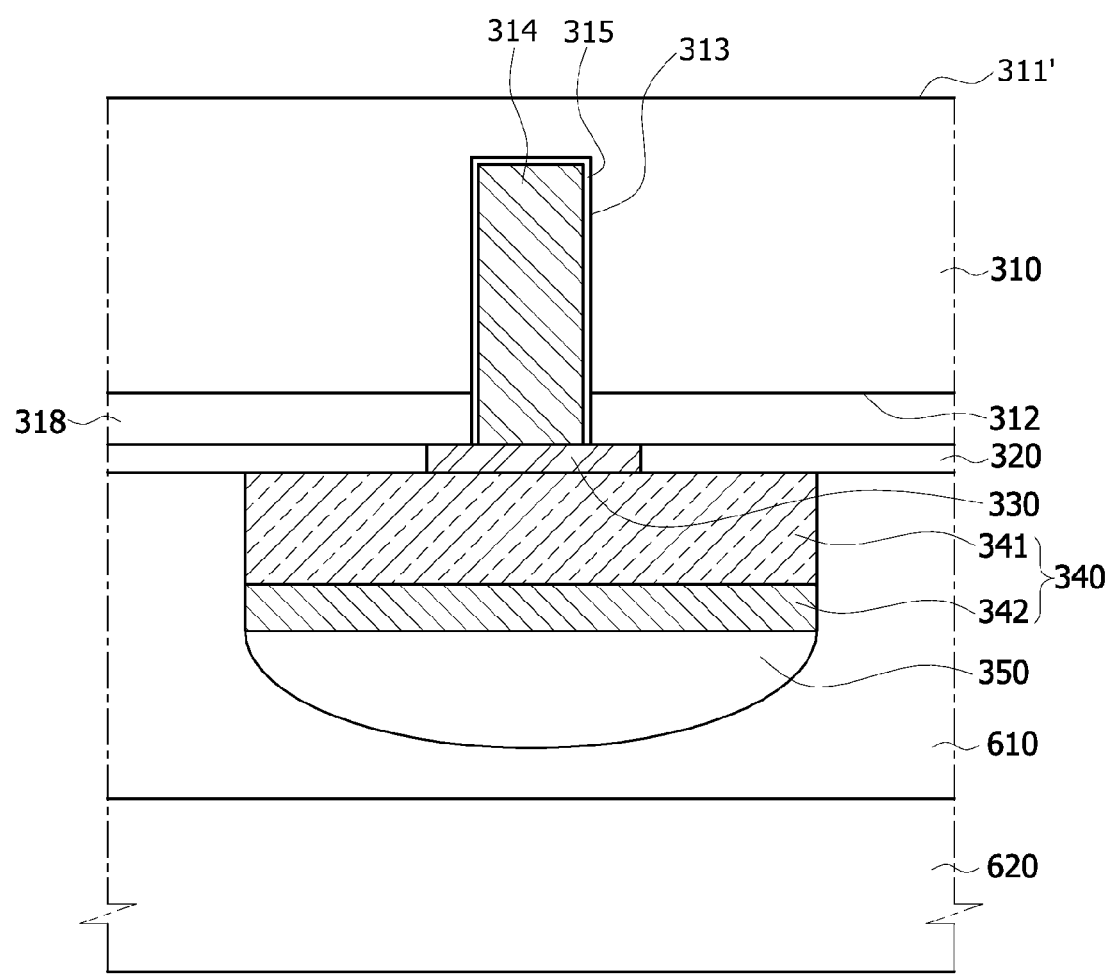
FIGS. 23 to 30 are cross-sectional views illustrating a method of fabricating a semiconductor device according to yet another embodiment.

FIGS. 23 to 30 are cross-sectional views illustrating a method of fabricating a semiconductor device according to yet another embodiment. Referring to FIG. 23, a chip body 310 having a second surface 312 and a third surface 311' may be provided. The third surface 311' may be an initial backside surface of the chip body 310 and may oppose the second surface 312 which may be a front side surface. An active layer 318 may be formed on the second surface 312 of the chip body 310. The active layer 318 may include an insulation layer that covers circuit elements such as transistors and interconnection lines constituting integrated circuits.

A through electrode 314 may penetrate the active layer 318 and extend into the chip body 310 toward the third surface 311'. An end of the through electrode 314 may be exposed at a surface of the active layer 318. In order to form the through electrode 314, a via hole 313 having a predetermined depth may be formed to penetrate the active layer 318 and to extend into the chip body 310. A diffusion barrier layer 315 may be formed on a sidewall and a bottom surface of the via hole 313. A conductive layer such as a copper layer may fill the via hole 313 surrounded by the diffusion barrier layer 315. As a result, the through electrode 314 may be formed in the via hole 313.

A connection pad 330 may be formed on the exposed end of the through electrode 314. The connection pad 330 may be formed in an opening of an insulation layer 320 deposited on a surface of the active layer 318 opposite to the chip body 310. A front side bump 340 may contact the connection pad 330. The front side bump 340 may include a first front side bump 341 and a second front side bump 342 which are sequentially stacked on a surface of the connection pad 330 opposite to the through electrode 314. The first and second front side bumps 341 and 342 may be formed of a copper (Cu) layer and a nickel (Ni) layer, respectively.

A solder layer 350 may be formed on a surface of the front side bump 340 opposite to the connection pad 330. The solder layer 350, the insulation layer 320 and the front side bump 340 may be attached to an auxiliary substrate 620 such as a carrier substrate using an adhesive layer 610. Accordingly, the third surface 311' of the chip body 310 may still be exposed even after the chip body 310 is attached to the auxiliary substrate 620.

Figure 24:
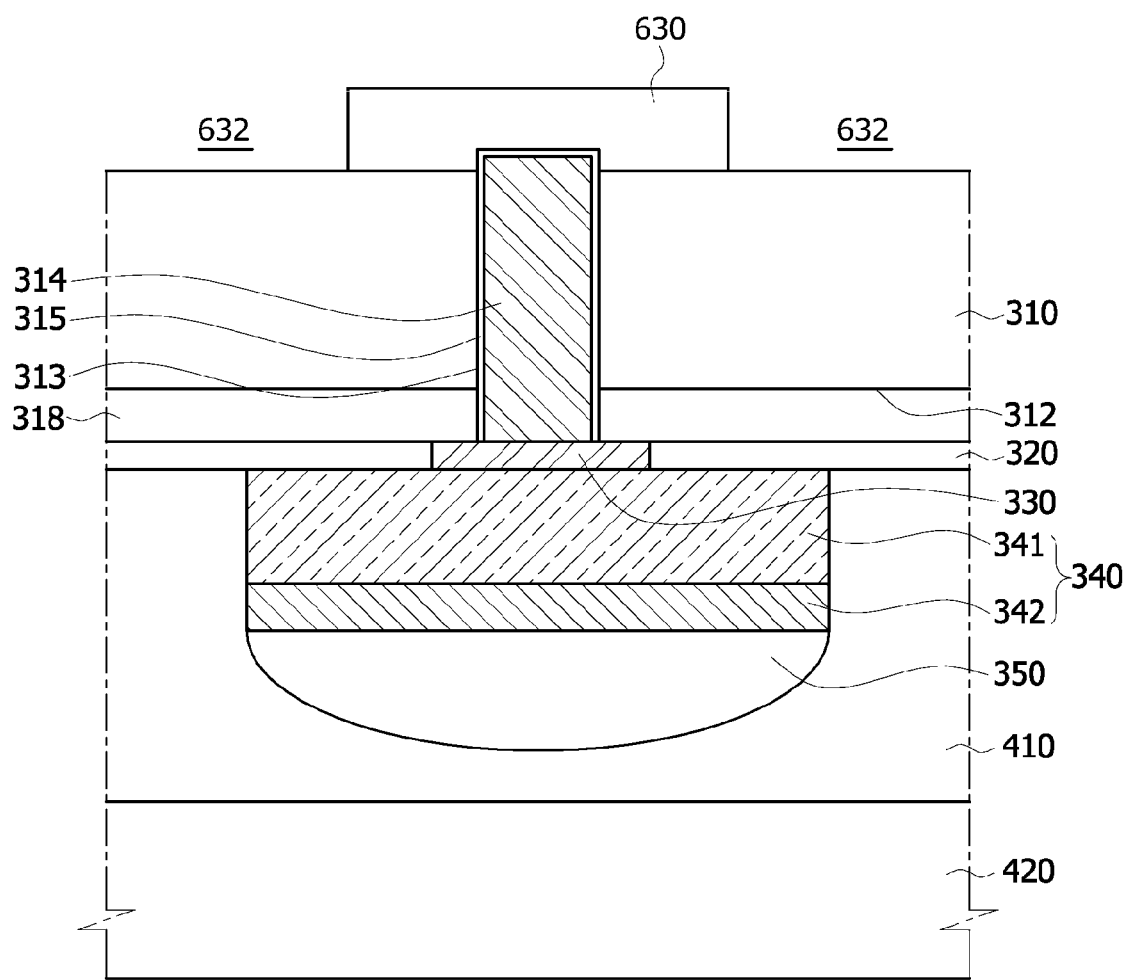

Referring to FIG. 24, a blanket etch process may be applied to the third surface (311' of FIG. 23) of the chip body 310. The blanket etch process may be performed using an etch-back technique. As a result of the blanket etch process, the third surface 311' of the chip body 310 may be recessed to expose a portion of the diffusion barrier layer 315 on an end of the through electrode 314. An etch buffer layer 630 may cover the exposed portion of diffusion barrier layer 315 and a portion of the chip body 310 adjacent to the exposed diffusion barrier layer 315. The etch buffer layer 630 may have an opening 632 that exposes edges of the recessed surface of the chip body 310. The etch buffer layer 630 may have a circular shape. In some embodiments, the etch buffer layer 630 may be formed of a material layer having a low etch selectivity with respect to the chip body 310.

Figure 25:
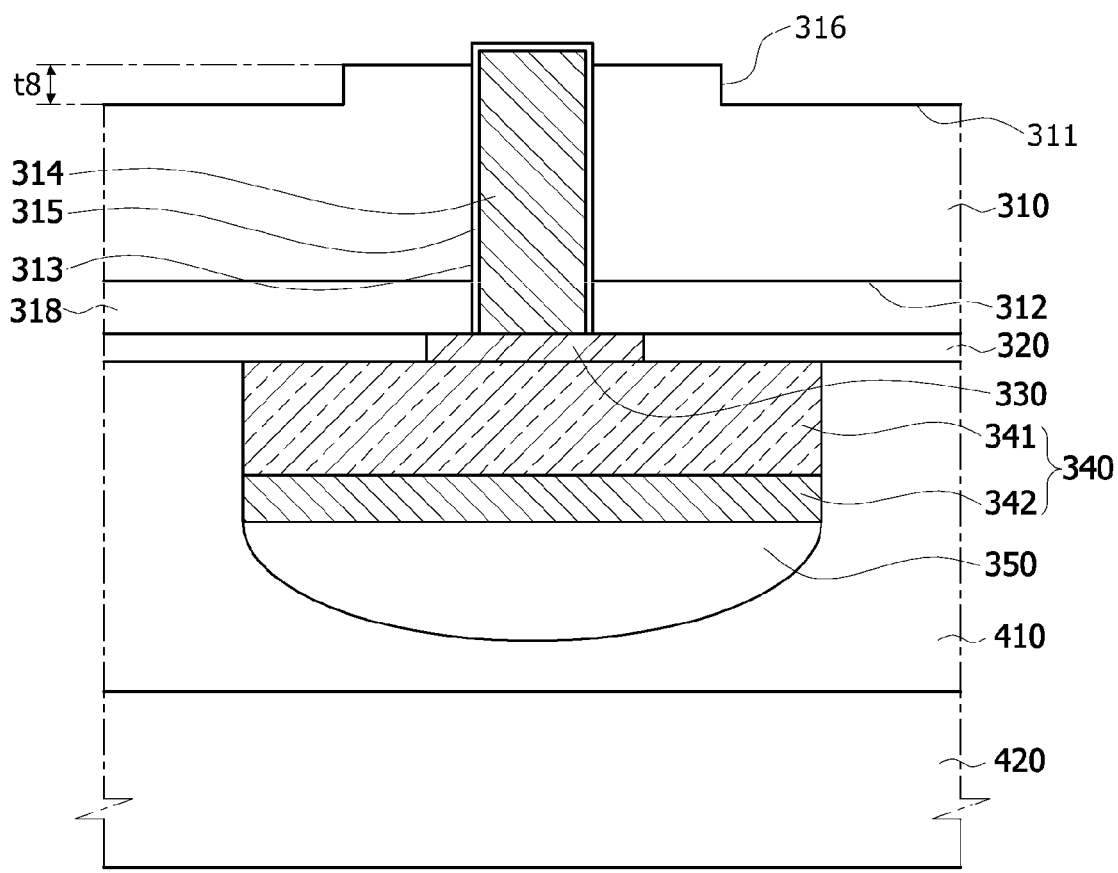

Referring to FIG. 25, an etch process may be applied to the etch buffer layer 630 and the chip body 310. While the etch process is performed, a portion of the chip body 310 exposed by the opening 632 may be etched and the etch buffer layer 630 may also be etched away to expose a portion of the chip body 310 under the etch buffer layer 630. As a result of the etch process, the portion of chip body 310 exposed by the opening 632 may be etched to have a first surface 311 and a protrusion 316 of the chip body 310 may be formed under the etch buffer layer 630 which is removed by the etch process. The protrusion 316 may have a height T8.

Figure 26:
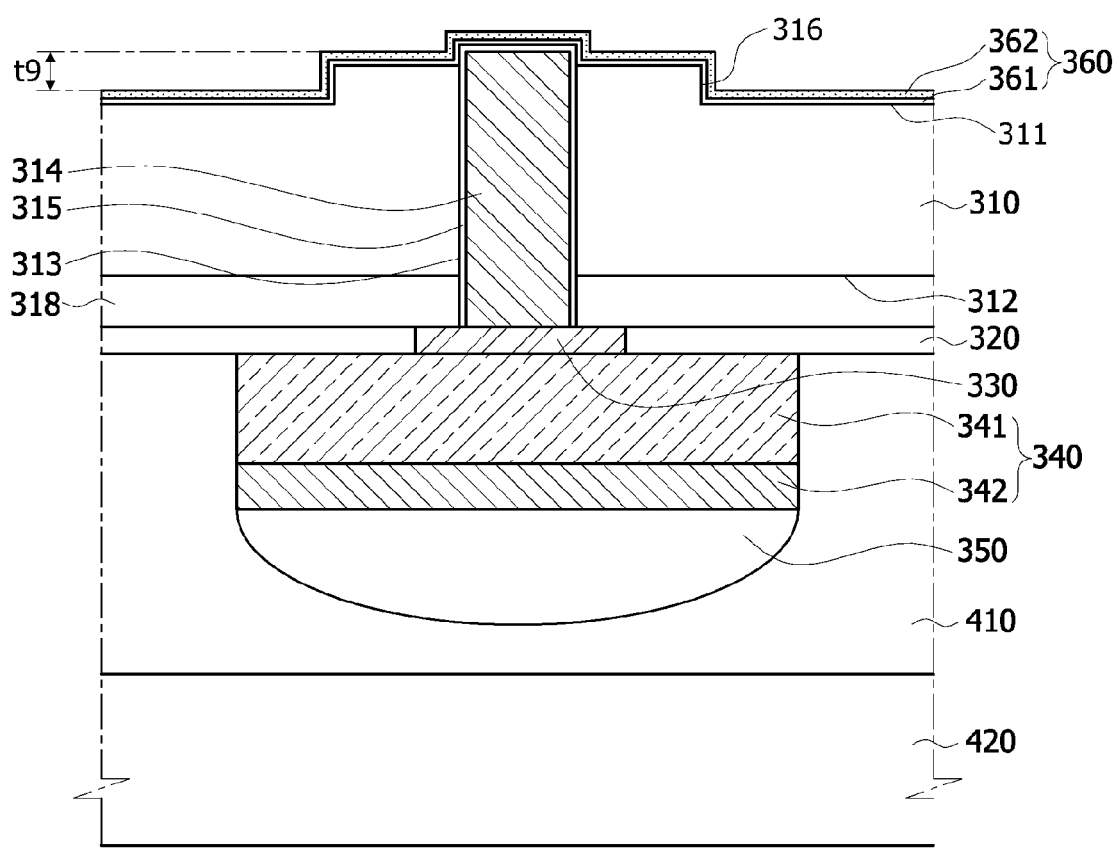

Referring to FIG. 26, a passivation layer 360 may cover the first surface 311 of the chip body 310 having the protrusion 316 and the exposed diffusion barrier layer 315 on the protruded end of the through electrode 314. The passivation layer 360 may be formed by sequentially stacking a first passivation layer 361 and a second passivation layer 362. The first and second passivation layers 361 and 362 may be formed of an oxide layer and a nitride layer, respectively. The passivation layer 360 may have a thickness appropriate to obtain a surface profile that is substantially consistent with a surface profile of the first surface 311 of the chip body 310. Thus, there may be a level difference T9 between the passivation layer 360 on a top surface of the protrusion 316 and the passivation layer 360 on the first surface 311 other than the protrusion 316, and the level difference T9 may be substantially equal to the height T8 of the protrusion 316.

Figure 27:
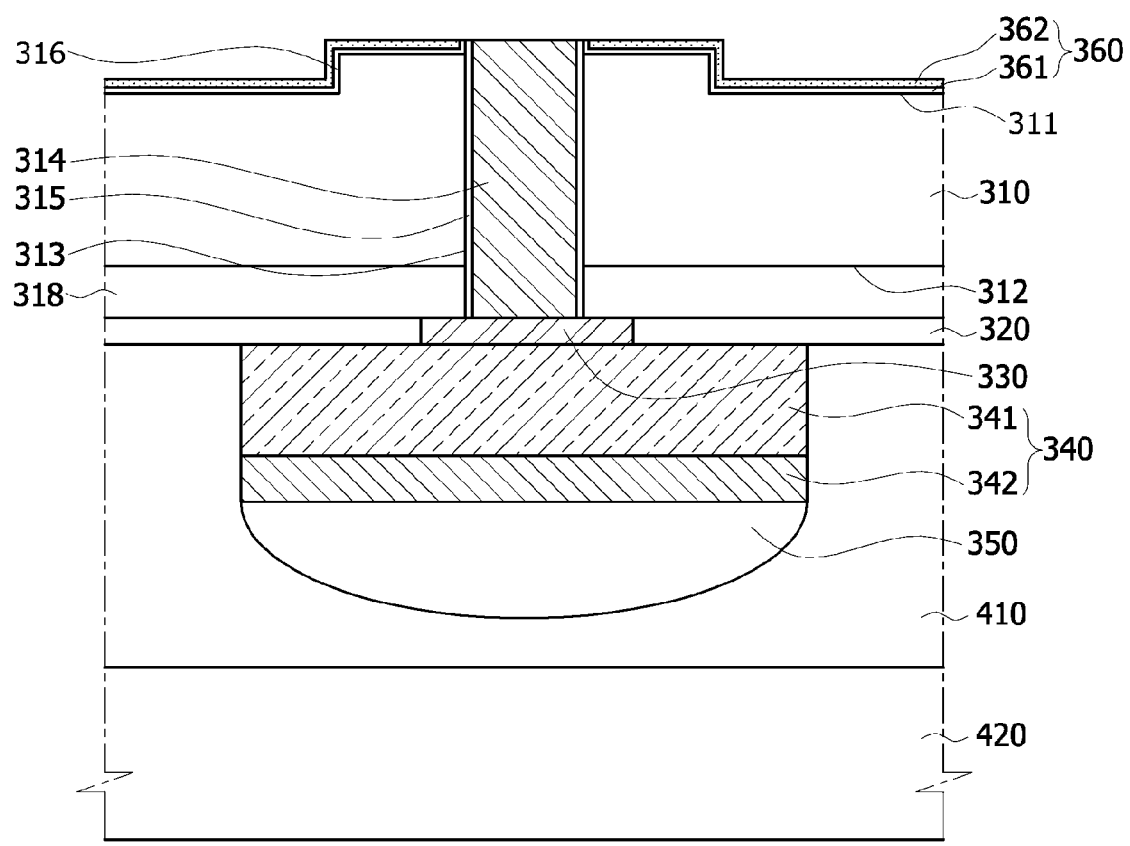

Referring to FIG. 27, a planarization process may be applied to the protruded end of the through electrode 314 to expose the through electrode 314. The planarization process may be performed using a chemical mechanical polishing (CMP) technique. The planarization process may be performed using the passivation layer 360 on the top surface of the protrusion 316 as a CMP stopper. As a result, a top surface of the planarized through electrode 314 may be coplanar with a top surface of the passivation layer 360 on the top surface of the protrusion 316.

Figure 28:
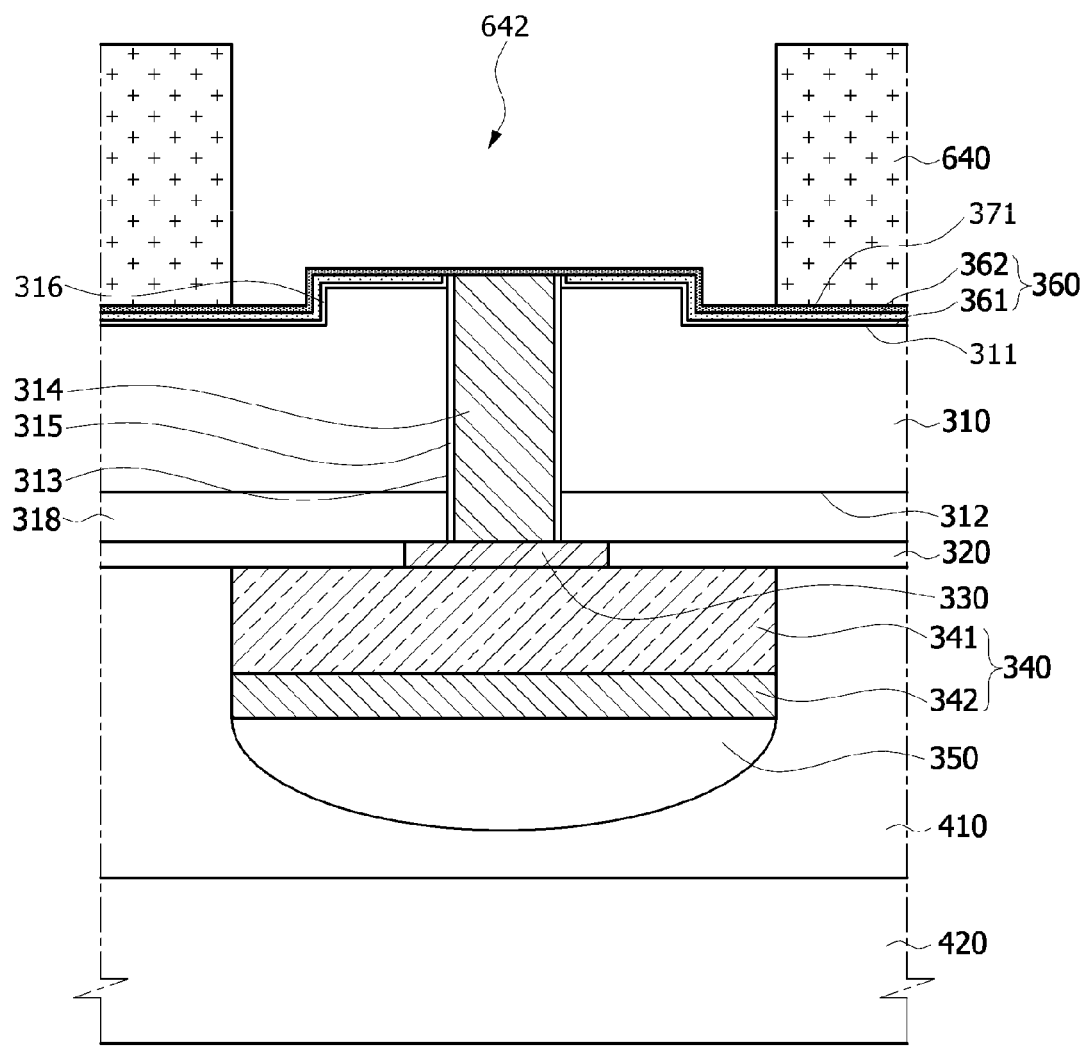

Referring to FIG. 28, a seed layer 371 may be formed on the passivation layer 360 and the planarized through electrode 314. The seed layer 371 may include a barrier metal layer. In some embodiments, the seed layer 371 may be a copper (Cu) layer. The seed layer 371 may be conformably formed on the passivation layer 360 to have a surface profile that is substantially consistent with a surface profile of the passivation layer 360 on the protrusion 316. Thus, a contact area between the seed layer 371 and the passivation layer 360 may be greater than a flat first surface 311 of the chip body 310 without the protrusion 316. Accordingly, an adhesive strength between the seed layer 371 and the passivation layer 360 may be improved. A mask pattern 640 having an opening 642 may be formed on the seed layer 371. In some embodiments, the mask pattern 640 may be a photoresist layer. The opening 642 of the mask pattern 640 may expose a portion of the seed layer 371 on the through electrode 314 and a portion of the seed layer 371 on the protrusion 316.

Figure 29:
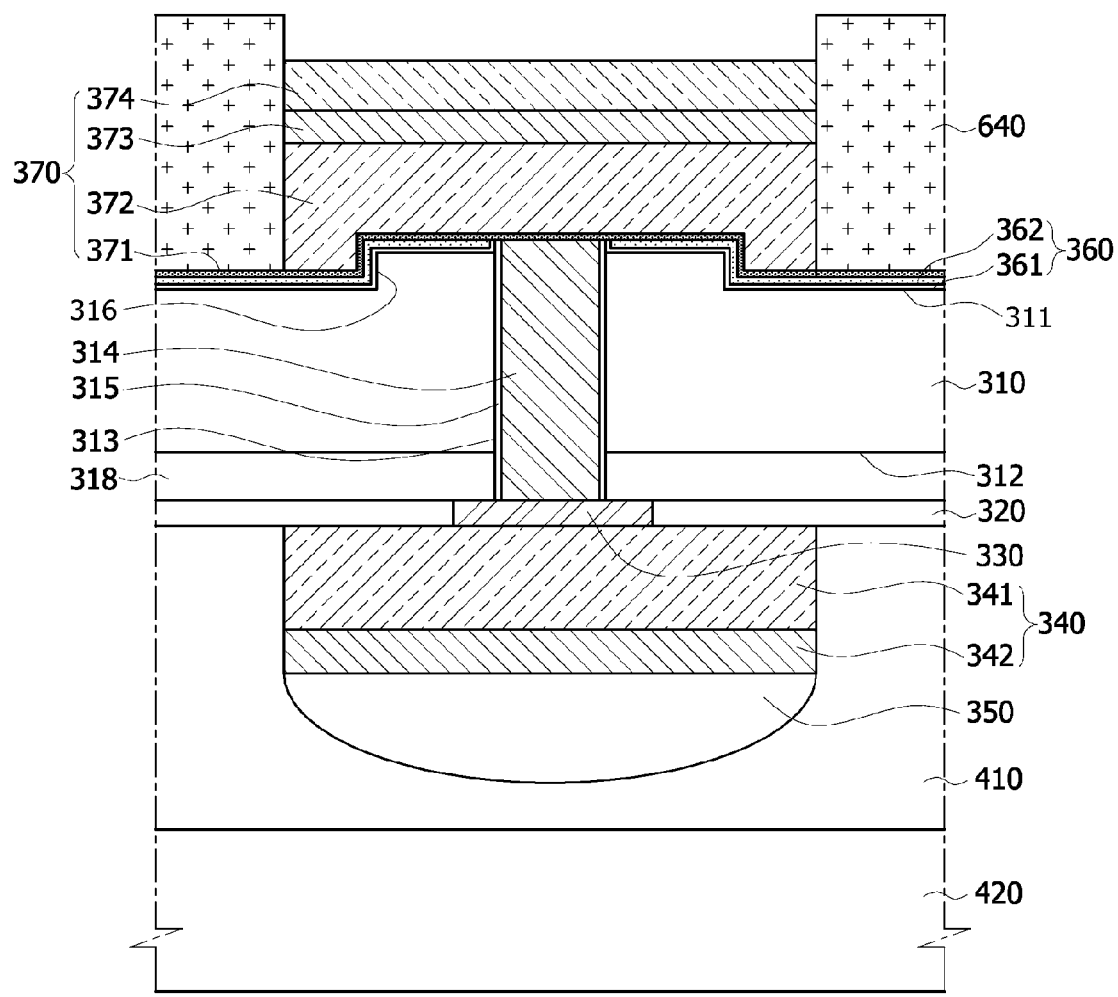

Referring to FIG. 29, a first backside bump 372, a second backside bump 373 and a third backside bump 374 may be sequentially formed on the portion of the seed layer 371 exposed by the opening 642 using a plating process. In some embodiments, the first backside bump 372, the second backside bump 373 and the third backside bump 374 may be formed of a copper (Cu) material, a nickel (Ni) material and a gold (Au) material, respectively. Subsequently, the mask pattern 640 may be removed to expose a portion of the seed layer 371.

Figure 30:
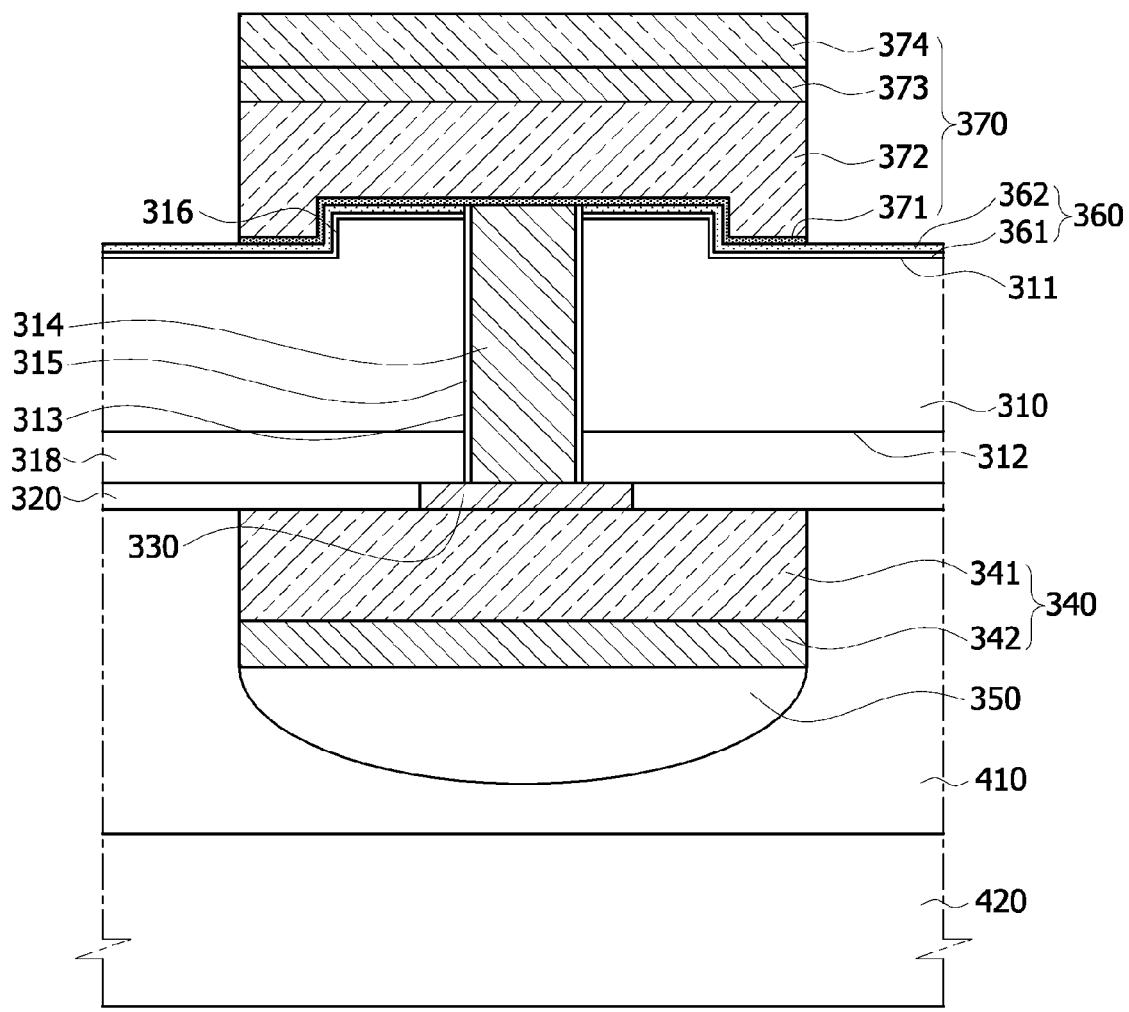

Referring to FIG. 30, the exposed portion of the seed layer 371 may be removed to form a patterned seed layer 371 that remains under the first backside bump 372. The patterned seed layer 371, first backside bump 372, the second backside bump 373 and the third backside bump 374 may constitute a backside bump 370. The exposed portion of the seed layer 371 may be removed using a wet etch process.

The semiconductor devices described above may be applied to various electronic systems.

Figure 31:
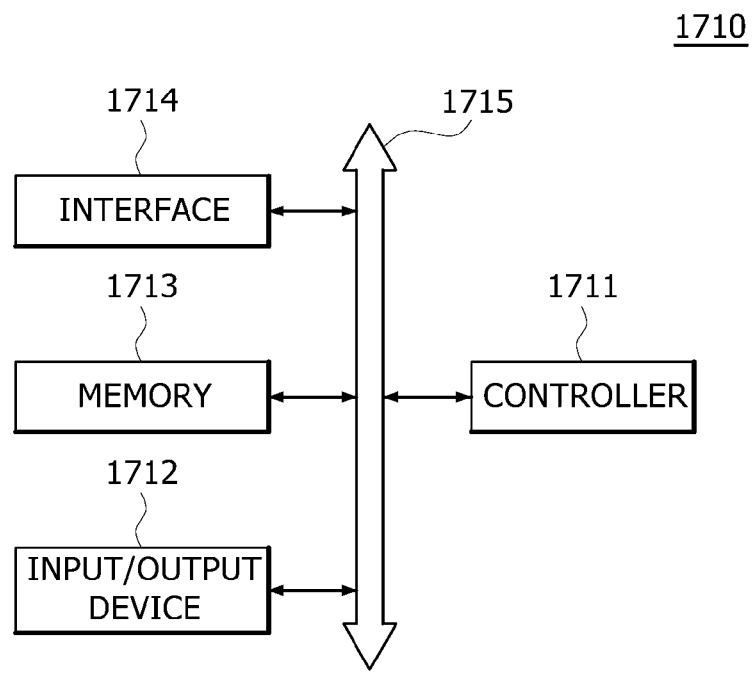
FIG. 31 is a block diagram illustrating an electronic system including at least one of semiconductor device according to an embodiment.

Referring to FIG. 31, at least one of the semiconductor devices in accordance with an embodiment may be employed in an electronic system 1710. The electronic system 1710 may include a controller 1711, an input/output unit 1712, and a memory 1713. The controller 1711, the input/output unit 1712 and the memory 1713 may be coupled to one another through a bus 1715 providing a path through which data are transmitted.

For example, the controller 1711 may include at least one microprocessor, at least one digital signal processor, at least one microcontroller, and logic devices capable of performing the same functions as these components. One of the controller 1711 and the memory 1713 may include any one of the semiconductor devices according to embodiments of the present disclosure. The input/output unit 1712 may include a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state drive (SSD). In such an embodiment, the electronic system 1710 may stably store a large amount of data in a flash memory system.

The electronic system 1710 may further include an interface 1714 for transmitting and receiving data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 32:
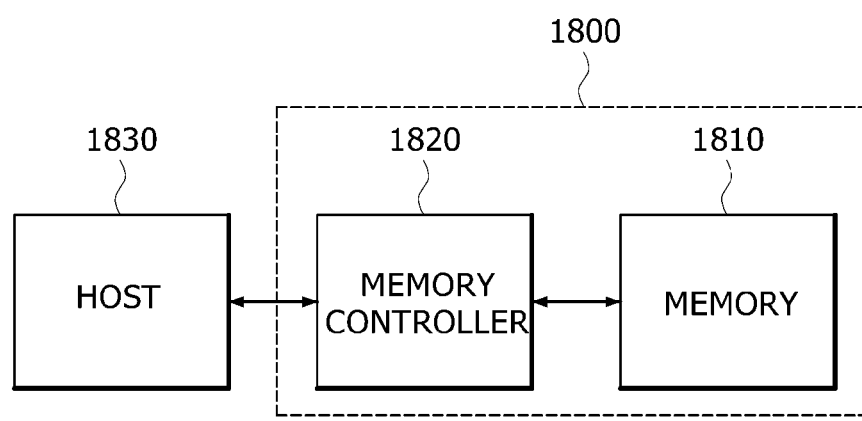
FIG. 32 is a block diagram illustrating another electronic system including at least one of semiconductor devices according to an embodiment.

Referring to FIG. 32, the semiconductor device in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one nonvolatile memory device to which the packaging technologies of embodiments of the present disclosure are applied. The memory controller 1820 may control the memory 1810 such that stored data is read out or data is stored in response to a read/write request from a host 1830.

Embodiments have been disclosed above for illustrative purposes. Those of ordinary skill in the art will appreciate that various modifications, additions and substitutions are possible, without departing from the scope and spirit of the accompanying claims.

What is claimed is:

1. A semiconductor device comprising:
a chip body having a first region, a second region, and a third region, wherein the first region and the third region have a first surface at a first level, and the second region has a second surface at a second level that is different from the first level;
a through electrode penetrating the chip body in the first region and having an end which is exposed by the chip body;
a passivation layer disposed on the first surface and the second surface of the chip body; and
a bump disposed on the passivation layer and the exposed end of the through electrode and entirely overlapping with the second region of the chip body,
wherein the first region is surrounded by the second region, and the second region is surrounded by the third region.

2. The semiconductor device of claim 1, further comprising an active layer disposed on an opposing surface of the chip body opposite to the first surface and the second surface.

3. The semiconductor device of claim 1, wherein the second level is lower than the first level.

4. The semiconductor device of claim 3, wherein the second region is defined by a trench having a predetermined depth from the first level.

5. The semiconductor device of claim 3, wherein the exposed end of the through electrode is located at a central portion of the first region.

6. The semiconductor device of claim 5, wherein the exposed end of the through electrode is spaced apart from an inner side of the second region by a predetermined distance.

7. The semiconductor device of claim 3, wherein the bump entirely overlaps with the first region and the second region, and partially overlaps with the third region adjacent to the second region.

8. The semiconductor device of claim 7, wherein the bump is disposed over an inner sidewall, an outer sidewall and a bottom surface of a portion of the passivation layer disposed in the second region.

9. The semiconductor device of claim 1, wherein the second level is higher than the first level.

10. The semiconductor device of claim 9, wherein the second region is defined by a protrusion having a predetermined height from the first level.

11. The semiconductor device of claim 9,
wherein the exposed end of the through electrode protrudes from the first surface of the chip body in the first region; and
wherein the exposed end of the through electrode is located at a central portion of the first region.

12. The semiconductor device of claim 11, wherein the exposed end of the through electrode is spaced apart from an inner side of the second region by a predetermined distance.

13. The semiconductor device of claim 9, wherein the bump entirely overlaps with the first region and the second region, and partially overlaps the third region adjacent to the second region.

14. The semiconductor device of claim 13, wherein the bump is disposed over an inner sidewall, an outer sidewall and a top surface of the passivation layer covering the second region.

15. The semiconductor device of claim 14, wherein the bump covers a portion of the passivation layer on a sidewall of the exposed end of the through electrode in the first region.

16. A semiconductor device comprising:
a chip body having a first region and a second region, wherein the first region has a first surface at a first level, and the second region has a second surface at a second level that is higher than the first level;
a through electrode penetrating the chip body in the second region and having an end which is exposed by the chip body;
a passivation layer disposed on the first surface and the second surface of the chip body; and
a bump disposed on the passivation layer and the exposed end of the through electrode and entirely overlapping with the second region of the chip body,
wherein the second region is surrounded by the first region.

17. The semiconductor device of claim 16, wherein the second region is defined by a protrusion having a predetermined height from the first level.

18. The semiconductor device of claim 17, wherein the exposed end of the through electrode is located at a central portion of the second region.

19. The semiconductor device of claim 18, wherein the bump entirely overlaps with the second region, and partially overlaps with the first region adjacent to the second region.

20. The semiconductor device of claim 19, wherein the bump is disposed over a portion of the passivation layer on a sidewall of the protrusion in the second region.

* * * * *